United States Patent
Bawolek et al.

(10) Patent No.: US 8,884,641 B2
(45) Date of Patent: Nov. 11, 2014

(54) METHODS AND SYSTEM FOR ELECTROSTATIC DISCHARGE PROTECTION OF THIN-FILM TRANSISTOR BACKPLANE ARRAYS

(75) Inventors: Edward J. Bawolek, Chandler, AZ (US); Curtis D. Moyer, Phoenix, AZ (US); Sameer M. Venugopal, San Jose, CA (US)

(73) Assignee: Arizona Board of Regents, a Body Corporated of the State of Arizona Acting for and on Behalf of Arizona State University, Scottsdale, AZ (US)

( * ) Notice: Subject to any disclaimer, the term of this patent is extended or adjusted under 35 U.S.C. 154(b) by 497 days.

(21) Appl. No.: 13/259,821

(22) PCT Filed: Feb. 23, 2010

(86) PCT No.: PCT/US2010/025043
§ 371 (c)(1),
(2), (4) Date: Nov. 23, 2011

(87) PCT Pub. No.: WO2010/123620
PCT Pub. Date: Oct. 28, 2010

(65) Prior Publication Data
US 2012/0062271 A1   Mar. 15, 2012

Related U.S. Application Data

(60) Provisional application No. 61/172,500, filed on Apr. 24, 2009.

(51) Int. Cl.
*G01R 31/26* (2014.01)
*G09G 3/00* (2006.01)

(52) U.S. Cl.
CPC ............ *G09G 3/006* (2013.01); *G01R 31/2621* (2013.01); *G01R 31/2642* (2013.01); *G01R 31/2607* (2013.01); *G01R 31/26* (2013.01); *G09G 2320/0295* (2013.01); *G09G 2330/04* (2013.01); *G09G 2330/10* (2013.01); *G09G 2330/12* (2013.01)
USPC ................................. 324/762.09; 324/762.01

(58) Field of Classification Search
USPC ........ 324/762.09, 762.01, 537, 500, 555, 770
See application file for complete search history.

(56) References Cited

U.S. PATENT DOCUMENTS 5,179,345 A * 1/1993 Jenkins et al. ................ 324/678
5,377,030 A 12/1994 Suzuki et al.
(Continued)

FOREIGN PATENT DOCUMENTS

EP  0525675  2/1993
EP  1365632  11/2003
(Continued)

OTHER PUBLICATIONS

Sambandan et al. (2009). Defect Identification in Large Area Electronic Backplanes. J Disp Tech 5(1): 27-33.
(Continued)

*Primary Examiner* — Hoai-An D Nguyen
(74) *Attorney, Agent, or Firm* — McDonnell Boehnen Hulbert & Berghoff LLP

(57) ABSTRACT

The present invention provides devices and methods for testing the electrical performance of thin-film transistor backplane arrays and protecting thin-films during testing and handling.

13 Claims, 30 Drawing Sheets

(56) References Cited

U.S. PATENT DOCUMENTS

| | | | |
|---|---|---|---|
| 6,509,602 B2* | 1/2003 | Yamazaki et al. | 257/314 |
| 7,256,777 B2* | 8/2007 | Jones et al. | 345/211 |
| 7,282,943 B2* | 10/2007 | Sakaguchi et al. | 324/762.09 |
| 8,722,432 B2* | 5/2014 | Bawolek et al. | 438/14 |
| 2002/0014851 A1 | 2/2002 | Tai et al. | |
| 2002/0047565 A1 | 4/2002 | Nara et al. | |
| 2002/0167472 A1 | 11/2002 | Jinno | |
| 2004/0095300 A1 | 5/2004 | So et al. | |
| 2004/0222815 A1 | 11/2004 | Kim et al. | |
| 2005/0219168 A1 | 10/2005 | Shirasaki et al. | |
| 2008/0117199 A1 | 5/2008 | Shie | |
| 2008/0315890 A1 | 12/2008 | Kasai et al. | |

FOREIGN PATENT DOCUMENTS

| | | |
|---|---|---|
| EP | 1447673 | 8/2004 |
| EP | 1517287 | 3/2005 |
| JP | 06082817 | 3/1994 |
| JP | 07104712 | 4/1995 |
| JP | 07199220 | 8/1995 |

OTHER PUBLICATIONS

Ng et al. (2007). Low temperature a-Si:H photodiodes and flexible image sensor arrays patterned by digital lithography. Appl. Phys. Lett. 91, 063505.

Apte et al. (1998). Large-area, low-noise amorphous silicon imaging system. Proc SPIE Electron Imag, San Jose, CA.

Yarema et al. (2000) A programmable, low noise, multichannel ASIC for readout of pixilated amorphous silicon arrays. Nucl Instrum and Methods in Phy Res A 439: 413-417.

Sheu et al. (1987). Modeling charge injection in MOS analog switches. IEEE Trans Circuits Syst CAS-34(2): 214-216.

Wegmann et al. (1987). Charge injection in analog MOS switches. IEEE J Solid-State Circuits SC-22(6): 1091-1097.

International Search Report of International Patent Application No. PCT/US2010/024990, filed Feb. 23, 2010, mailed Dec. 23, 2010.

International Search Report of International Patent Application No. PCT/US2010/025043, mailed May 11, 2010.

\* cited by examiner

METHODS AND SYSTEM FOR ELECTROSTATIC DISCHARGE PROTECTION OF THIN-FILM TRANSISTOR BACKPLANE ARRAYS

RELATED APPLICATIONS

This application claims priority to U.S. Provisional Application Ser. No. 61/172,500 filed Apr. 24, 2009, incorporated by reference herein in its entirety.

STATEMENT OF GOVERNMENT INTEREST

This work was supported at least in part by U.S. Army Research Labs (ARL) Grant No. W911NF-04-2-005. The U.S. Government has certain rights in the invention.

FIELD OF INVENTION

The present invention relates to the testing of electrical devices. Specifically, the invention relates to devices and methods for testing the electrical performance of thin-film transistor backplane arrays used in a variety of display technologies.

BACKGROUND

A wide variety of electronic devices incorporate displays to present an image to a viewer. Made up of one or more transistors per pixel, thin-film transistor (TFT) backplane arrays can be used to activate the portions of a display that present an image to the viewer. Since the performance of a display is dependent upon the backplane array used to drive the display, backplane arrays are typically tested to identify electrical defects such as short circuits, open circuits, or other manufacturing defects.

One known method of testing backplane arrays includes connecting one or more wires to each transistor in each pixel element of a backplane array. In high-resolution displays comprising hundreds of thousands, or even millions, of transistors, the addition of these wires can significantly increase the cost and complexity of the backplane array. In applications where the space provided for a backplane array is limited, the need to include additional wires or other connections to each transistor can severely limit the number of transistors that can be included in the backplane array, and thus the number of pixel elements that can be used in the display.

SUMMARY

In a first aspect, the present invention provides devices for testing a thin-film transistor (TFT) backplane array comprising (i) a first decoder electrically coupled to each of the plurality of row connections on the thin-film transistor backplane array and (ii) a second decoder electrically coupled to each of the plurality of column connections on the thin-film transistor backplane array. In this first aspect, the decoders may also be located on the same substrate as the thin-film transistor backplane array.

The devices of the first aspect may be used with thin-film transistor backplane arrays used to drive pixel elements in displays. For example, the devices of the first aspect may be used with thin-film transistor backplane arrays used to drive electrophoretic displays, liquid crystal displays, or organic LED displays.

In a second aspect, the present invention provides devices for testing a thin-film transistor backplane array comprising: (i) a first decoder electrically coupled to each of the plurality of row connections on the thin-film transistor backplane array; (ii) a second decoder electrically coupled to each of the plurality of column connections on the thin-film transistor backplane array; and (iii) an electrical component capable of providing a severable electrical connection between a first portion of the device and a second portion of the device. The devices of the second aspect may be configured such that the first portion of the device to which a severable connection is made is a decoder address line. The devices of this aspect may also be configured such that the first portion of the device to which a severable connection is made is a decoder bias line. Further, the decoders included in the second aspect may be configured such that the first portion of the device is a decoder address line and the second portion of the device is a decoder bias line. In such a configuration, an electrical component is capable of providing a severable connection between a decoder address line and a decoder bias line.

In the devices of the second aspect, the electrical component capable of providing a severable connection between a first portion of the device and a second portion of the device comprises a fuse. In other embodiments of the devices of the second aspect, the electrical component providing a severable connection between a first portion of the device and a second portion of the device comprises an electrostatic discharge protection component. In some embodiments of devices of this aspect that include an electrostatic discharge protection component, the electrostatic discharge protection component establishes an electrical connection between at least two portions of the device in response to the presence of an electrical current with a magnitude greater than a predetermined level. In other embodiments of devices of this aspect that include an electrostatic discharge protection component, the electrostatic discharge protection component establishes an electrical connection between at least two portions of the device in response to the presence of a voltage with a magnitude greater than a predetermined level.

In a third aspect, the present invention provides methods for testing thin-film transistor backplane array comprising: (i) activating a first decoder to address one or more pixels in the thin-film transistor backplane array; (ii) measuring an electrical current drawn from a supply; and (iii) correlating the measured electrical current to an electrical defect in the thin-film transistor backplane array. In implementations of the methods of this aspect, the methods may further comprise activating a second decoder to address one or more pixels in the thin-film transistor backplane array. In example implementations of methods where two decoders are used, the decoders can be used to activate a single pixel, a row of pixels, a column of pixels, a plurality of pixels, or even all of the pixels in display.

In a fourth aspect, the present invention provides methods for testing a thin-film transistor backplane array comprising (i) activating a first decoder and a second decoder to address a plurality of pixels in the thin-film transistor backplane array; and (ii) optically evaluating the plurality of pixels. The methods of this aspect may further comprise disconnecting the first decoder and the second decoder from the thin-film transistor backplane array upon completion of a test of the thin-film transistor backplane array.

In a fifth aspect, the present invention provides methods for testing a thin-film transistor backplane array comprising: (i) activating a first decoder to address a pixel element within the thin-film transistor backplane array; (ii) activating a second decoder to address the pixel element within the thin-film transistor backplane array; (iii) measuring an electrical response within the thin-film transistor backplane array; (iv)

determining whether the magnitude of the measured electrical response exceeds a predetermined level; and (v) responsive to a determination that the electrical current exceeds a predetermined level, activating a fuse to sever an electrical connection between a portion of the thin-film transistor backplane array and another electrical component. In some example implementations of the methods of the fifth aspect, measuring an electrical response within the thin-film transistor backplane array comprises measuring an electrical current. In other example implementations of the methods of the fifth aspect, measuring an electrical response within the thin-film transistor backplane array comprises measuring an electrical voltage.

In a sixth aspect, the present invention provides methods for testing a thin-film transistor backplane array comprising: (i) activating a first decoder to address a pixel element within the thin-film transistor backplane array; (ii) activating a second decoder to address the pixel element within the thin-film transistor backplane array; (iii) measuring an electrical response within the thin-film transistor backplane array; (iv) determining whether the magnitude of the measured electrical response exceeds a predetermined level; and (v) responsive to a determination that the electrical current exceeds a predetermined level, establishing an electrical connection that electrically bypasses the pixel element. In some example implementations of the methods of the sixth aspect, measuring an electrical response within the thin-film transistor backplane array comprises measuring an electrical current. In other example implementations of the methods of the sixth aspect, measuring an electrical response within the thin-film transistor backplane array comprises measuring an electrical voltage.

Any of the methods of the present invention may be implemented by a computer program, and may be carried out using any of the devices according to any aspect and embodiment of the present invention.

DETAILED DESCRIPTION OF EXEMPLARY EMBODIMENTS

Figure 1:
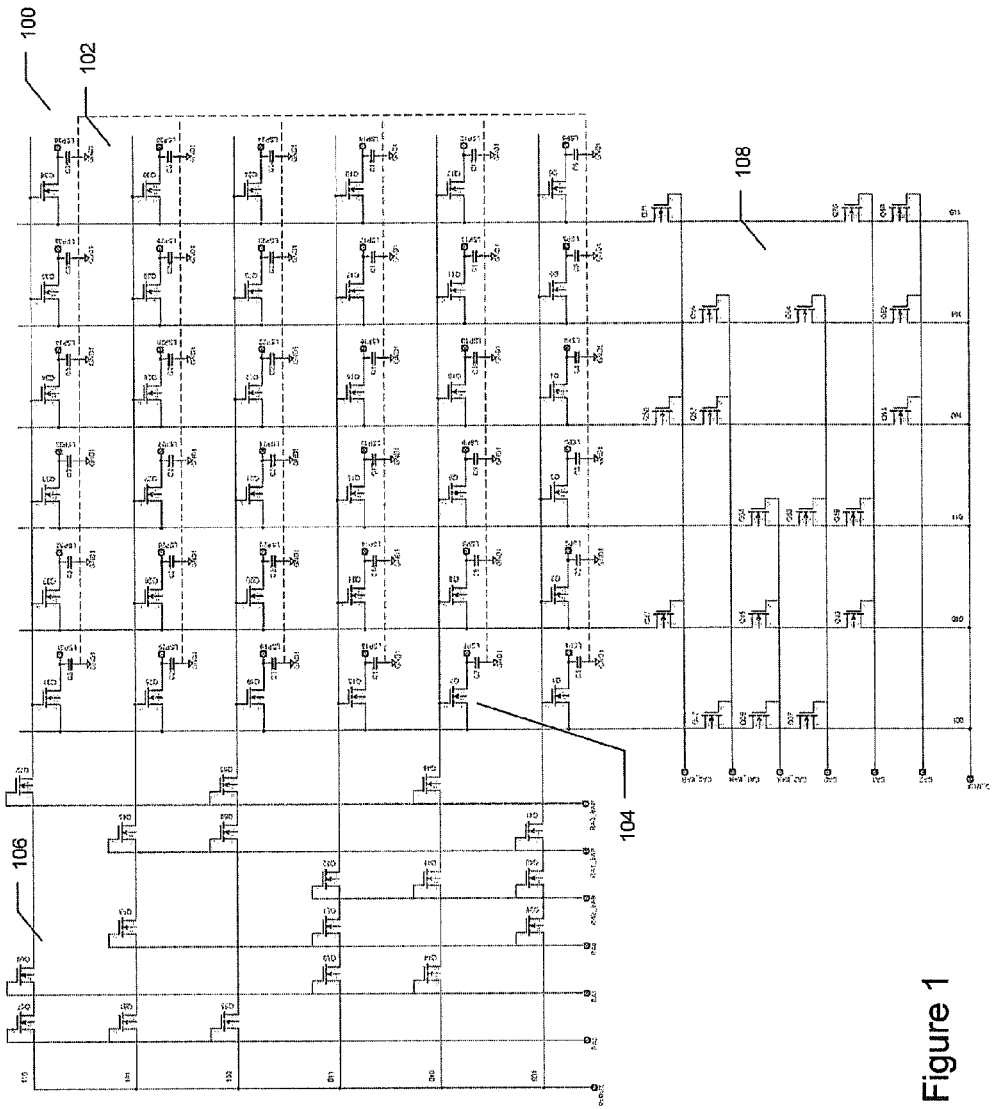
FIG. 1 depicts a schematic diagram of a device for testing a thin-film transistor backplane array in accordance with a first embodiment of the invention.

In a first aspect, the present invention provides devices for testing a thin-film transistor (TFT) backplane array comprising (i) a first decoder electrically coupled to each of the plurality of row connections on the thin-film transistor backplane array and (ii) a second decoder electrically coupled to each of the plurality of column connections on the thin-film transistor backplane array.

As used herein, the term "thin-film transistor backplane array" refers to any array of transistors formed by depositing thin films of material over a substrate. While the embodiments described herein are primarily directed towards thin-film transistor backplane arrays that are used to activate the pixel elements in displays, the claimed devices and methods may be used with any thin-film transistor backplane array. In thin-film transistor backplane arrays that activate pixel elements in a display, an image can be formed and changed by selectively applying voltages to one or more transistors. In some implementations of thin-film transistor backplane arrays, each transistor is electrically connected to its own set of dedicated control lines. In arrays that comprise thousands, or even millions, of transistors, the dedicated control lines for each transistor can introduce additional complexity and bulk to the array. Such additional complexity and bulk is compounded if a separate set of dedicated control lines are added to facilitate testing of the display.

In many thin-film transistor backplane arrays, a plurality of transistors is arranged into a series of rows and columns. In such arrays, one terminal of all of the transistors in a given row can be electrically coupled together to form a row connection, and a second terminal of all of the transistors in a given column can be electrically coupled together to form a column connection such that a particular transistor or group of transistors may be selectively activated by applying an electrical signal to the appropriate row connection and column connection. In accordance with the devices of the first aspect of the invention, a first decoder is electrically coupled to each of the plurality of row connections and a second decoder is electrically coupled to each of the plurality of column connections.

As used herein, the term "decoder" refers to any component capable of coupling one or more input signal connections to a plurality of output signal connections in response to an address, the address presented as a series of binary signals. Any method of electrically coupling the decoders to the appropriate row and column connections may be used. For example, the decoders may be integrated into the thin-film transistor backplane array, such that the array and the decoders are formed as part of the same manufacturing process. Alternatively, the decoders may be manufactured separately from the array, and later coupled to the array using electrical couplings and/or solder, for example.

In this first aspect, the first and/or second decoders may be 1×N decoders, where a single input connection can be coupled to one or more of the plurality of output connections present on the decoder, denoted by the term "N". In some example embodiments, "N" equals the number of row or column connections available on the thin-film transistor backplane array that the decoder may connect with. In an example embodiment of a decoder, the decoder may be controlled by one or more address lines. When a particular address value is applied to the address lines, the decoder responds by coupling one or more inputs to the output connection or connections associated with the particular address value.

The first and/or second decoders may also be 2×N, 3×N, or higher order decoders. In implementations where the decoder is a 2×N, 3×N, or higher order decoder, the decoder can be used to provide a plurality of selectable voltages, currents, or signals to the row and/or column connections of the backplane array. For example, a 2×N or higher order decoder may be implemented to provide guard connections to one or more portions of an array, or may be used to provide a selectable bias level. For example, a row or column adjacent to a row or column under test could be held at an alternate potential, such as reverse bias. In other implementations, a neutral, or zero potential, or a guard and/or a test bias could also be among the selectable potentials available in implementations using higher-order decoders.

The decoders of the devices of this first aspect may be constructed from any of a variety of materials. In decoders that utilize transistors or other semi-conducting devices, any materials that can be used to form semiconductors can be used to form the decoders. In an example embodiment, the decoders may be constructed such that at least a portion of the first decoder and/or at least a portion of the second decoder comprise amorphous silicon. In other examples, materials such as polysilicon, microcrystalline silicon, other semiconductors and/or metal oxides, and/or organic materials can be used to form the decoders.

The decoders may be fabricated on any substrate used in the fabrication of thin-film transistor backplane arrays. For example, glass, flexible steel, silicon, the flexible plastic PEN (polyethylene napthalate), and other substrate materials may be used. While in some implementations the decoders may be fabricated on the same substrate as the backplane array, the decoders may also be fabricated on a different substrate and later integrated with the backplane array.

Further, since in some implementations, the decoders are not intended to be permanently functional components, the decoders can be operated at voltages that would be otherwise unsuitable for the transistors within the backplane array. Operating the decoders at higher voltages may allow for additional output from the decoders, and allow the use of smaller transistors within the decoder.

The devices of the first aspect may be used with thin-film transistor backplane arrays used to drive pixel elements in displays. For example, the devices of the first aspect may be used with thin-film transistor backplane arrays used to drive electrophoretic displays, liquid crystal displays, organic LED displays, or other varieties of displays, now known or developed later.

In a second aspect, the present invention provides devices for testing a thin-film transistor backplane array comprising: (i) a first decoder electrically coupled to each of the plurality of row connections on the thin-film transistor backplane array; (ii) a second decoder electrically coupled to each of the plurality of column connections on the thin-film transistor backplane array; and (iii) an electrical component capable of providing a severable electrical connection between a first portion of the device and a second portion of the device. In this aspect, any of the decoders that may be included in the devices of the first aspect may be included in the devices of the second aspect.

The devices of the second aspect may be configured such that the first portion of the device to which a severable connection is made is a decoder output line. As used herein, a "decoder output line" is any electrical connection between an output of a decoder and a row or column connection on the thin-film transistor backplane array. Those skilled in the art will understand that a decoder may couple a single line (or node) to one or more nodes under the control of one or more address lines. Those skilled in the art will also appreciate that the terms "input" and "output" will be understood in light of the application involving a decoder, and may be interpreted in light of the direction of current flow and/or signal flow.

The devices of this aspect may also be configured such that the first portion of the device to which a severable connection is made is a decoder bias line. As used herein, the term "decoder bias line" refers to any connection between a voltage supply and an input connection of a decoder. Further, the decoders of the second aspect may be configured such that the first portion of the device is a decoder address line and the second portion of the device is a decoder bias line. In such a configuration, an electrical component is capable of providing a severable connection between a decoder address line and a decoder bias line.

In the devices of the second aspect, the electrical component capable of providing a severable connection between a first portion of the device and a second portion of the device comprises a fuse. Various fuse devices may be used in the devices of the second aspect. For example, a two-terminal fuse may be used, where the first terminal of the fuse is electrically coupled to one portion of the circuit, and the second terminal of the fuse is electrically coupled to another portion of the circuit. In another example, a three-terminal fuse may be used.

The fuses used in this aspect may serve a number of purposes. In one example embodiment, fuses are added to the thin-film transistor backplane array to prevent damage due to the discharge of electricity during the manufacture and assembly of the array and the overall display. This can be achieved by using fuses to connect multiple row and column connections together and/or to a ground connection. In some configurations that protect the array during the manufacturing and assembly, the fuses can be removed before testing the array. In other configurations, the fuses may remain in place throughout a test. The fuses can also be oriented to prevent the decoders from supplying too much power or applying too much current to the array. Further, fuses can be used to form the electrical connection between the decoders and the row and column connections on the array. In such configurations, opening the fuses upon the completion of a test may facilitate the removal of the decoders.

In example embodiments comprising a three-terminal fuse, the three-terminal fuse is configured such that a first terminal of the fuse is electrically coupled to one portion of the circuit, with a severable connection formed between the first portion of the circuit and a second terminal of the fuse. A second severable connection is formed between the second terminal of the fuse and the third terminal of the fuse, which is in turn connected to a second portion of the circuit. In this configuration, a surge in voltage or current that causes the first severable connection of the fuse to open is passed to the second severable connection of the fuse, which then opens. As a result, the fuse prevents damage to the portions of the circuit it is connected to, such as the transistors in the thin-film transistor backplane array, by ensuring that the protected portions of the circuit are not exposed to abnormally high voltages or currents. In configurations where the three-terminal fuse must be removed before a test can be performed, the three-terminal fuse structure reduces the likelihood that the power applied to open the fuses will damage the array.

In example implementations of a three-terminal fuse, the two severable connections within the fuse may be sized differently to enable the severable connections to sever under different conditions. For example, a first severable connection may be sized smaller than the second severable connection. In this configuration, the smaller severable connection may sever in the presence of a lower current than the second severable connection, and may sever first in the presence of a current that is sufficient to cause both connections to sever. By sizing the severable connections differently, the order in which the severable connections sever may be preselected during design and fabrication of the particular three-terminal fuse.

In example implementations of a three terminal fuse, a severable connection is constructed by forming a "necked-down" region within the device, where a conductive path within the device is shaped to be thinner or narrower, or otherwise uses less conductive material than the conductive paths within the adjacent portions of the device. The necked-down region is configured such that when a current above a predetermined threshold is passed through the device, the current density within the device is greatest in a necked-down region. Those skilled in the art will appreciate that the increase in current density within the necked-down region may increase the resistive heating experienced within the necked down region. This increase in current density, and the resulting increase in resistive heating can cause the conductor within the necked-down region to evaporate or boil away, and cause an open electrical circuit.

The three-terminal fuses may also be used for current sensing within a portion of a circuit. For example, if the fuse has a known resistance, a voltage across the fuse can be measured and correlated to a current. In implementations where the severable connections within a three-terminal fuse are configured to sever at different currents, an approximation of the current can be determined by observing whether both severable connections remain intact, one of the severable connections has severed while the second remains intact, or both severable connections have severed.

In other embodiments of the devices of the second aspect, the electrical component providing a severable connection between a first portion of the device and a second portion of the device comprises an electrostatic discharge protection component. In some embodiments of devices of this aspect that include an electrostatic discharge protection component, the electrostatic discharge protection component establishes an electrical connection between at least two portions of the device in response to the presence of an electrical current with a magnitude greater than a predetermined level. In other embodiments of devices of this aspect that include an electrostatic discharge protection component, the electrostatic discharge protection component establishes an electrical connection between at least two portions of the device in response to the presence of a voltage with a magnitude greater than a predetermined level. In some example embodiments, the electrostatic discharge protection device normally appears as an open circuit, and does not allow electrical signals to pass through the electrostatic discharge protection device under normal operating conditions. In such examples embodiments, the electrostatic discharge protection device forms a closed circuit when an abnormally high voltage or current is detected, and can be used to direct the abnormally high voltage or current away from sensitive circuit components.

In example embodiments of devices of the second aspect, the electrostatic discharge protection device may be formed using a plurality of field effect transistors. The plurality of transistors may be electrically connected such that the drain of one transistor is connected to the source of a second transistor, and the gates of one or more transistors are connected to the nodes formed by the connection of the drains and sources of the transistors.

In example embodiments of devices of the second aspect, the electrostatic discharge protection devices may be configured to break down and conduct electricity in the presence of an electrical potential that is lower than the electrical potential required for other transistors within the array to break down. For example, if the other transistors break down at a voltage greater than 200 volts, the electrostatic discharge protection devices can be configured and constructed to break down at 200 volts or less, and thus can protect the rest of the array by diverting potentially damaging electrical signals away from sensitive portions of the array before the transistors within the array are subjected to electrical potentials that could cause the transistors to break down.

In example embodiments of devices of the second aspect, at least as portion of the first decoder and at least a portion of the second decoder may comprise amorphous silicon. Any of the materials and configurations used in the decoders described in the first aspect of the invention may be used for decoders included in devices of the second aspect. Exemplary embodiments of devices in accordance with the second aspect of the invention may include decoders that comprise amorphous silicon and are configured such that (i) the first decoder is a 1×N decoder; (ii) the second decoder is a 1×N decoder; and (iii) the electrical component capable of providing a severable connection between the first portion of the device and the second portion of the device comprises a fuse. In example devices with a first and a second decoder, the decoders may have the same number of output connections or different numbers of output components. For example, the first decoder may be a 1×N decoder and the second decoder may be a 1×M decoder, where N and M may be different numbers. In other example devices that comprise amorphous silicon, the devices are configured such that (i) the first decoder is a 1×N decoder; (ii) the second decoder is a 1×N decoder; and (iii) the electrical component capable of providing a severable connection between the first portion of the device and the second portion of the device comprises an electrostatic discharge protection component.

In a third aspect, the present invention provides methods for testing thin-film transistor backplane arrays comprising: (i) activating a first decoder to address one or more pixels in the thin-film transistor backplane array; (ii) measuring an electrical current drawn from a supply; and (iii) correlating the measured electrical current to an electrical defect in the thin-film transistor backplane array. Any of the decoders described in the first and second aspects of the invention may be used in the methods of the third aspect, and any technique for activating the first decoder may be used. For example, a control signal, such as a digital control signal or an analog control signal, may be applied by a test operator to the input of the decoder. In another example, the decoder may be configured such that one or more row or column connections in the array are always addressed. In yet another example, a computer may be coupled to the decoder, and software instructions executed by the computer may be used to activate the decoder. In example implementations of methods where two decoders are used, both decoders may be activated to address a single pixel, a row of pixels, a column of pixels, a plurality of pixels, or even all of the pixels in display.

Any method of measuring a current drawn from a supply may be used in accordance with the methods of this aspect. For example, a current meter may be inserted between the current supply and another portion of the thin-film transistor backplane array. Alternatively, a current meter may be integrated into the current supply. As another example, a voltage measurement may be converted mathematically to determine the current drawn from the supply. In an example implementation of the method, a resistor with a known resistance is electrically connected in series between the current supply and the array, and the current drawn from the supply is determined by dividing a voltage measured across the resistor by the known resistance. In implementations of the methods of this aspect, the methods may further comprise activating a second decoder to address one or more pixels in the thin-film transistor backplane array.

To correlate the measured electrical current to an electrical defect in the thin-film transistor backplane array, the measured electrical current may be compared to a set of reference measurements for the thin-film transistor backplane array. The set of reference measurements may include expected current readings that indicate the proper performance of one or more transistors within the array, and may also include ranges of readings that indicate particular faults within the array. For example, the set of reference measurements may include expected current responses of a transistor with an abnormal short circuit between two terminals, an abnormal open circuit condition, and/or a variety of other abnormalities that may arise during the manufacturing, processing, and handling of the thin-film transistor backplane array.

In some implementations of the methods of this aspect, the method may further comprise disconnecting the first decoder and the second decoder from the thin-film transistor backplane array. In such example implementations, the decoders may be disconnected from the backplane array after the completion of a test, reducing or eliminating the need for the packaging of the display to accommodate the decoders. For example, if a decoder is positioned adjacent to the array, the decoder may be cut away from the array. As another example, if the decoder is connected to the array via electrical couplings, the decoder may be disconnected by removing the couplings.

In the methods of the third aspect, correlating the measured electrical current to an electrical defect in the thin-film transistor backplane array may further comprise identifying an electrical defect in a specific pixel in the thin-film transistor backplane array. For example, an operator or computer that is running a test of a display may correlate the measured current with a particular transistor that was addressed at the time the current was measured, and identify the pixel that is driven by the faulty transistor. In addition to identifying that an electrical defect is present in a particular pixel, the method may also comprise classifying the electrical defect. As described above, the measured current may indicate that there is a short circuit between one or more of the terminals of a transistor in a pixel element, an open circuit where an electrical connection should be present, or a variety of other defects that may arise during the manufacturing, processing, and handling of a thin-film transistor backplane array. These electrical defects may be further correlated to a performance characteristic of the pixel element. For example, one type of electrical defect may cause a pixel element to remain on, while a second type of electrical defect may cause a pixel element to remain off, and a third type of defect may cause a pixel to operate intermittently or unpredictably.

In a fourth aspect, the present invention provides methods for testing a thin-film transistor backplane array comprising: (i) activating a first decoder and a second decoder to address a plurality of pixels in the thin-film transistor backplane array; and (ii) optically evaluating the plurality of pixels. Any of the decoders described herein or that may be used with any other the other aspects of the present invention may be used in example implementations of the methods of this aspect. Further, any of the methods for activating the decoders described herein or that may be used with any of the other methods of the present invention may be used to activate the decoders in the methods of this aspect.

The plurality of pixels may be optically evaluated in a number of different ways. In one example implementation, the thin-film transistor backplane array is electrically coupled to a plurality of pixel elements in a display to allow the transistors to drive the pixel elements. As one or more transistors within the array are activated, the performance of the pixel elements can be observed to determine if the display is performing properly.

In example implementations of the methods of the fourth aspect, the methods may also comprise activating the first decoder and the second decoder to address a plurality of pixels in the thin-film transistor backplane array to form a predetermined image. In such implementations, optically evaluating the plurality of pixels may comprise comparing the predetermined image formed by the addressed pixels in the thin-film transistor backplane array to a reference image. For example, the reference image may be a test pattern, a collection of letters or symbols, or any other image that can be formed on the display. In implementations that include comparing the predetermined image formed by the addressed pixels to a reference image, the methods may further comprise: (i) detecting a difference between the formed image and the reference image; and (ii) responsive to the detection of a difference between the predetermined image formed by the addressed pixels in the thin-film transistor backplane array and the reference image, correlating the detected difference to an electrical defect in a pixel in the thin-film transistor backplane array.

Any method for detecting a difference between the formed image and the reference image may be used. For example, an optical scanner may be used to view the image formed during a test and compare the formed image to the reference image. In another example, an operator may manually compare the image formed during a test to a copy of the reference image. To correlate a detected difference to an electrical defect in the array, the detected difference may be compared to a set of known failure characteristics as described above.

The methods of the fourth aspect may further comprise identifying the location of a pixel with an electrical defect and responsive to identifying the location of a pixel with an electrical defect, adjusting either the first decoder or the second decoder such that the pixel with an electrical defect is not addressed. For example, the location of the pixel with an electrical defect can be identified by recording which transistor or transistors were addressed when an abnormal condition was identified. Once the address of a potentially problematic transistor is identified, either or both of the decoders may be adjusted by changing a control signal sent to the input of a decoder, for example. Alternatively, adjusting the first decoder and the second decoder such that the pixel with an electrical defect is not addressed may comprise severing an electrical connection between the thin-film transistor backplane array and a portion of either the first decoder or the second decoder. In an example implementation where a fuse is placed in series between an output connection of the decoder and a row or column connection, the fuse could be selectively opened to sever the electrical connection between the decoder and the row or column that contains a defective component. Alternatively, the electrical connection between a portion of the decoder and the array may be severed by cutting the electrical connection, or any other method of disconnecting two points in a circuit.

As described above, the methods of this aspect may further comprise disconnecting the first decoder and the second decoder from the thin-film transistor backplane array upon completion of a test of the thin-film transistor backplane array.

In a fifth aspect, the present invention provides methods for testing a thin-film transistor backplane array comprising: (i) activating a first decoder to address a pixel element within the thin-film transistor backplane array; (ii) activating a second decoder to address the pixel element within the thin-film transistor backplane array; (iii) measuring an electrical response within the thin-film transistor backplane array; (iv) detecting whether the magnitude of the measured electrical response exceeds a predetermined level; and (v) responsive to a detection that the electrical response exceeds a predetermined level, activating a fuse to sever an electrical connection between a portion of the thin-film transistor backplane array and another electrical component.

Any of the decoders described herein and any of the decoders that may be used in other aspects of the invention may be used in this aspect of the invention. Further, the decoders may be activated to address a pixel element in accordance with any of the methods that may be used with any aspect of the present invention. In addition, measuring an electrical response within the thin-film transistor backplane array can be done in accordance with any of the methods described herein or known to those skilled in the art. In some example implementations of the methods of the fifth aspect, measuring an electrical response within the thin-film transistor backplane array comprises measuring an electrical current. In other example implementations of the methods of the fifth aspect, measuring an electrical response within the thin-film transistor backplane array comprises measuring an electrical voltage.

Detecting that the magnitude of the measured electrical response exceeds a predetermined level can be performed by a fuse, such as any of the fuses described herein, and the predetermined level of the electrical response can be set as one of the construction parameters of the fuse. In response to an abnormally high voltage or current within the array, the fuse singulates and breaks the electrical connection between the portions of the circuit that were previously connected by the fuse.]

In a sixth aspect, the present invention provides methods for testing a thin-film transistor backplane array comprising: (i) activating a first decoder to address a pixel element within the thin-film transistor backplane array; (ii) activating a second decoder to address the pixel element within the thin-film transistor backplane array; (iii) measuring an electrical response within the thin-film transistor backplane array; (iv) determining whether the magnitude of the measured electrical response exceeds a predetermined level; and (v) responsive to a determination that the electrical current exceeds a predetermined level, establishing an electrical connection that electrically bypasses the pixel element. In some example implementations of the methods of the sixth aspect, measuring an electrical response within the thin-film transistor backplane array comprises measuring an electrical current. In other example implementations of the methods of the sixth aspect, measuring an electrical response within the thin-film transistor backplane array comprises measuring an electrical voltage.

Any of the decoders described herein and any of the decoders that may be used in other aspects of the invention may be used in this aspect of the invention. Similarly, the decoders may be activated to address a pixel element in accordance with any method that may be used with any aspect of the present invention. In addition, measuring an electrical response within the thin-film transistor backplane array can be done in accordance with any of the methods described herein or known to those skilled in the art. In some example implementations of the methods of the sixth aspect, measuring an electrical response within the thin-film transistor backplane array comprises measuring an electrical current. In other example implementations of the methods of the sixth aspect, measuring an electrical response within the thin-film transistor backplane array comprises measuring an electrical voltage.

Detecting that the magnitude of the measured electrical response exceeds a predetermined level can be performed by an electrostatic discharge protection component, such as any of the electrostatic discharge protection components described herein, and the predetermined level of the electrical response can be set as one of the construction parameters of the electrostatic discharge protection component. When an abnormally high voltage or current is detected within the array, the electrostatic discharge protection component can activate to establish a new electrical connection between the portions of the circuit that were previously not connected to bypass a problematic element within the thin-film transistor backplane array.

Those skilled in the art will appreciate that in a thin-film transistor backplane array, the thin-film transistors within the array may be sized and constructed to meet a set of desired performance characteristics for the display. For example, the array may have a desired service life that extends for a period of time well beyond the time necessary to test the array and incorporate the array into another device. However, in example implementations of the devices and methods described herein, test structures, including the decoders, fuses, electrostatic discharge protection devices may be considered temporary structures, in the sense that they may be removed after the testing or manufacturing process. Thus, in such example implementations, the decoders, fuses, electrostatic discharge protection devices and other test structures may be constructed to only survive the testing process, allowing for smaller sizing of the transistors used for testing the array. Further, in implementations where the testing structures are considered temporary, transistors that degrade under electrical stress, such as transistors that incorporate amorphous silicon, may be used. Also, in such example implementations, the transistors in a decoder may be overdriven or otherwise operated in a manner that would result in the failure of a transistor, because the transistor within the testing structure does not need to survive the test, and the transistor within the testing structure may be fabricated in a manner that ensures it would fail before a properly constructed transistor within the array would fail.

Any of the methods of the present invention may be implemented by a computer program, and may be carried out using any of the devices according to any aspect and embodiment of the present invention. The computer program may be implemented in software or in hardware, or a combination of both hardware and software.

EXAMPLES

Referring now to the figures, FIG. 1 depicts a simplified schematic diagram of device 100 for testing a thin-film transistor backplane array 102. As shown in FIG. 1, thin-film transistor backplane array 102 comprises a plurality of pixel elements, such as pixel element 104, arranged in a plurality of rows and columns. While the thin-film transistor backplane array 102 depicted in FIG. 1 is suitable for use in an LCD display, any type of thin-film transistor backplane array used to drive any type of display may be incorporated into device 100.

Decoders 106 and 108 are electrically coupled to thin-film transistor backplane array 102. Decoder 106 may be referred to as a row decoder, and is electrically coupled to the row connections of thin-film transistor backplane array 102. Decoder 108 may be referred to as a column decoder, and is electrically coupled to the column connections of thin-film transistor backplane array 102. As depicted in FIG. 1, the number of output connections available on decoder 106 may be equal to the number of row connections on thin-film transistor backplane array 102, and the number of output connections available on decoder 108 may be equal to the number of column connections on thin-film transistor backplane array 102. However, the number of output connections available on either or both of decoders 106 and 108 may not match the number of available row or column connections.

In implementations where the number of available output connections exceeds the number of available row and/or column connections on the thin-film transistor backplane array 102, the extra decoder output connections may be electrically connected to other portions of the backplane array 102, may be electrically connected to other circuit elements, or may be left unconnected. In implementations where the number of available output connections is less than the number of available row and/or column connections, the output connections on decoders 106 and/or 108 may be electrically connected to a subset of the available row and/or column connections.

Both decoders 106 and 108 can be activated by applying one or more electrical control signals to the inputs of the decoders 106 and/or 108. The signals can be used to cause the decoder to apply an electrical voltage and/or current to one or more of the row and column connections in backplane array 102. In an example embodiment, each row connection and each column connection in backplane array 102 can be identified by an address that can be expressed as a digital number. When control voltages corresponding to a desired address are applied to the inputs of decoder 106 or 108, a voltage is applied by the activated decoder to the row or column at the desired address. As shown in FIG. 1, decoders 106 and 108 are activated by control signals that correspond to the address of the desired row or column and the digital inverse of the desired row or column. However, any method of activating a decoder may be used.

Figure 2:
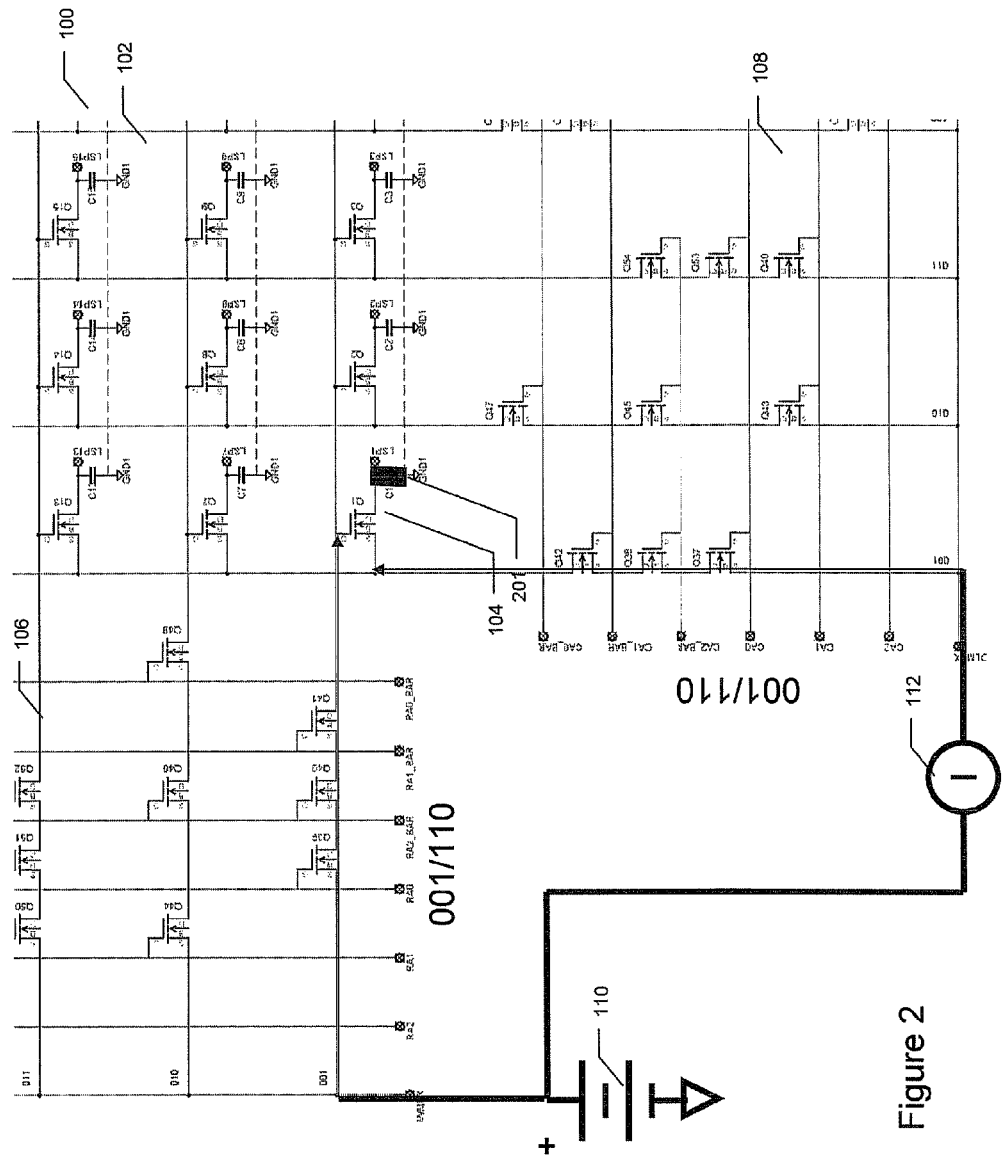
FIGS. 2-9 depict schematic diagrams of example configurations of a device for testing a thin-film transistor backplane array in accordance with a first embodiment of the invention.

FIG. 2 depicts a portion of device 100, showing a portion of thin-film backplane array 102 and decoders 106 and 108. In FIG. 2, a voltage supply 110 is electrically coupled to both decoders 106 and 108. In addition, a current sensor 112 is electrically coupled between the voltage supply 110 and the column decoder 108. As depicted in FIG. 2, a control signal, denoted as 001/110, which corresponds to the address and digital inverse of the address for a particular row connection in backplane array 102 has been applied to row decoder 106, which allows an electrical connection to be formed between the selected row in the backplane array 102 and the voltage supply 110. A similar control signal, also denoted as 001/110 has been applied to column decoder 108, establishing an electrical connection between the selected column of backplane array 102 and the current sensor 112. Skilled artisans will appreciate that the individual connections and voltage supplies comprising the control signals are not shown, to avoid obscuring the present invention.

Pixel element 104 is the pixel element located at the intersection of the selected row and the selected column in backplane array 102, and is activated. In the absence of a defect, pixel element 104 draws a known electrical current which can be detected and measured by current sensor 112. However, as shown in FIG. 2, there is a short circuit 201 in pixel element 104, causing an electrical connection between the drain of the transistor in pixel element 104 and ground. If a short circuit such as short circuit 201 is present in the pixel element 104, the pixel element 104 will draw a different amount of current. Consequently, by comparing the current drawn by activated pixel element 104 to the expected current draw, the presence of the short circuit 201 can be detected.

Figure 3:
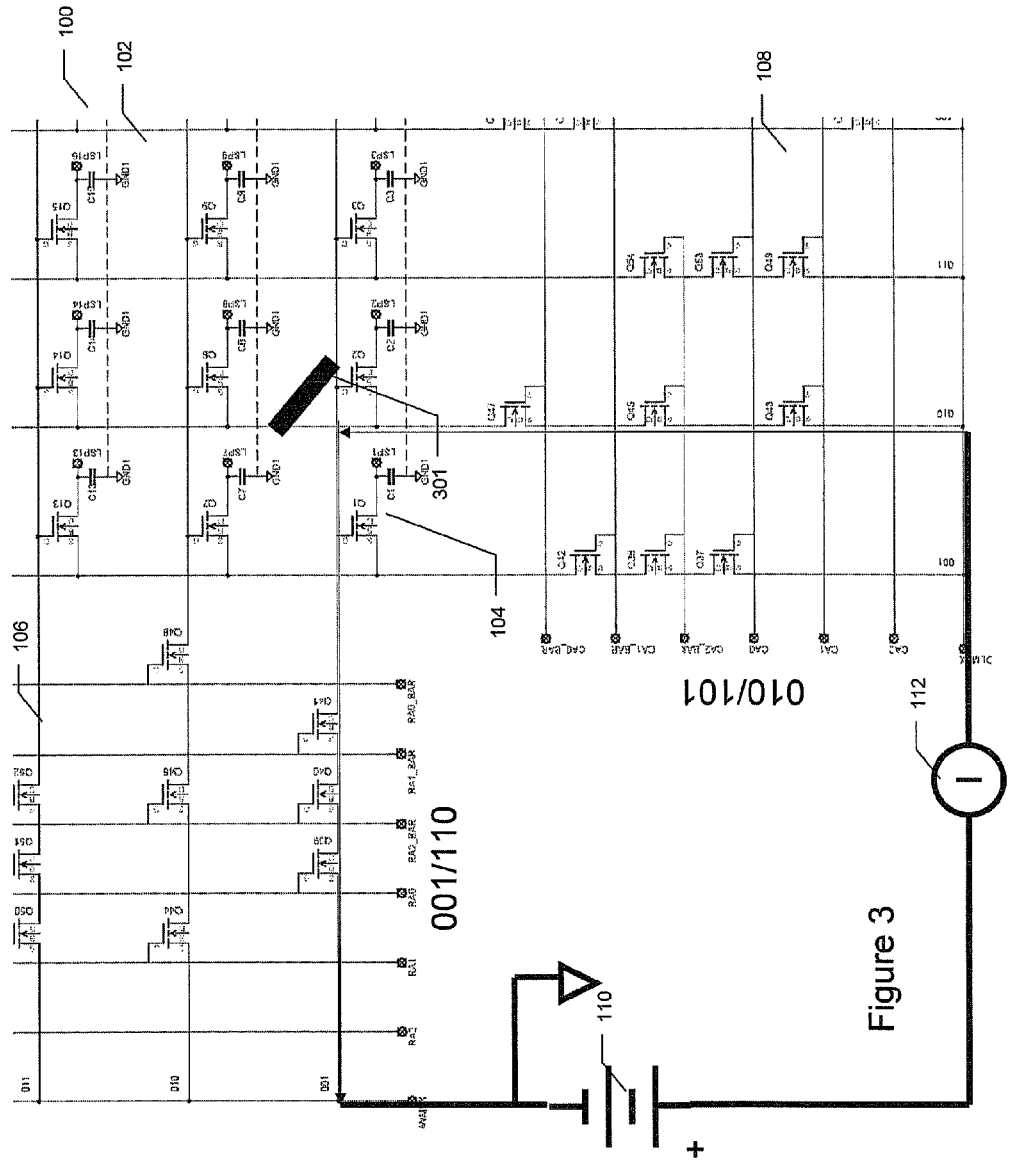

FIG. 3 also depicts a portion of device 100, including a portion of thin-film backplane array 102 and decoders 106 and 108. The voltage supply 110 is electrically coupled to both decoders 106 and 108. In addition, a current sensor 112 is electrically coupled between the voltage supply 110 and the column decoder 108. In FIG. 3, a control signal, denoted as 001/110, has been applied to row decoder 106, which allows an electrical connection to be formed between a row in the backplane array 102 and the voltage supply 110. A similar control signal, also denoted as 010/101 has been applied to column decoder 108, establishing an electrical connection between the selected column of backplane array 102 and the current sensor 112.

As with FIG. 2, activating one or more rows and one or more columns in backplane array 102 causes a known electrical current to be drawn from the voltage supply 110, and the drawn current can be detected and measured by current sensor 112. As depicted in FIG. 3, short circuit 301 is a defect in backplane 102. If the short circuit 301 is present in backplane array 102, the current drawn by backplane array 102 will differ from the known current, allowing for the detection of short circuit 301.

Figure 4:
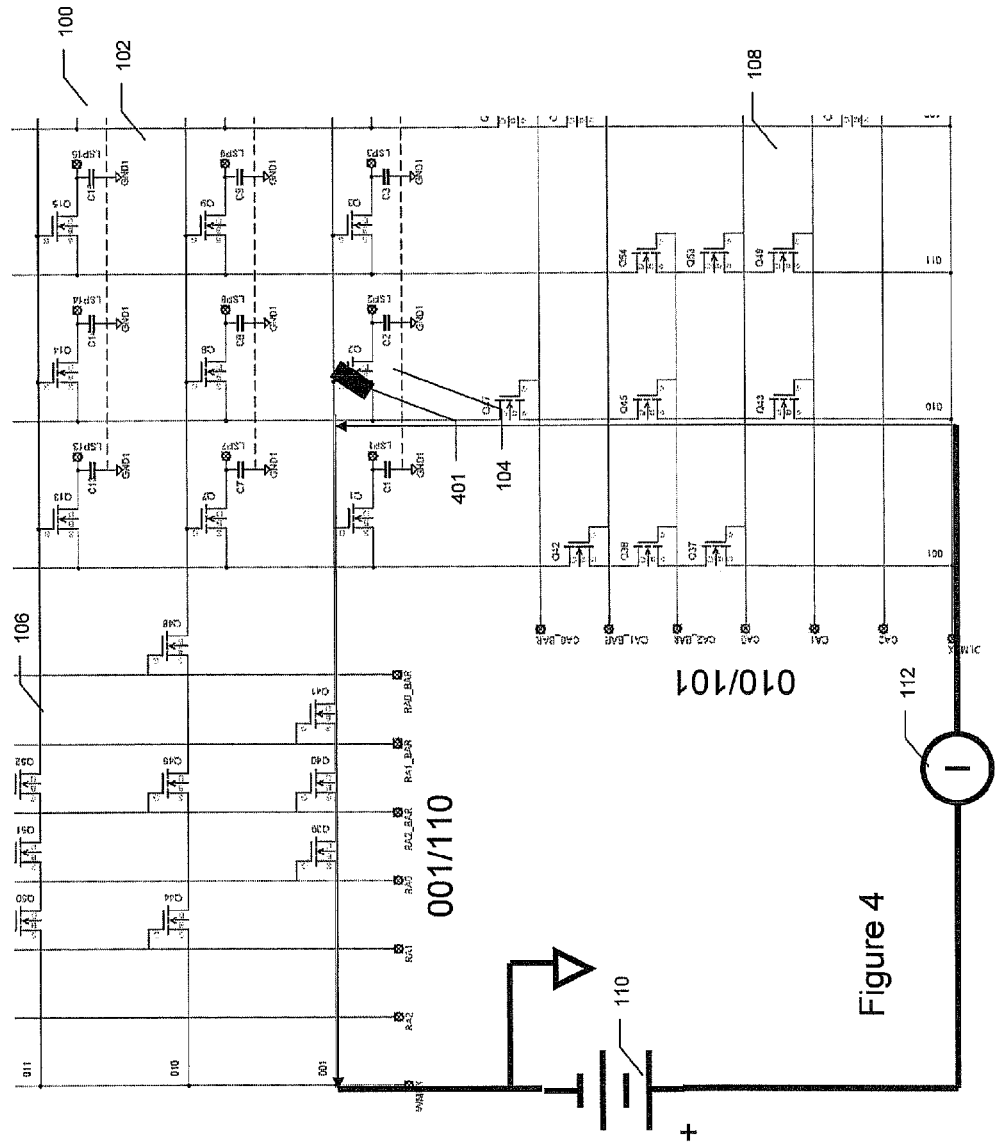

FIG. 4 also depicts the portion of device 100, depicted in FIGS. 2 and 3, including backplane array 102, pixel element 104, row decoder 106, column decoder 108, voltage supply 110, and current sensor 112. As depicted in FIG. 4, short circuit 401 is a defect that establishes an undesired electrical connection between the gate and the source terminals of the transistor within pixel element 104. If the short circuit 401 is present in the backplane array 102, the current drawn by backplane array 102 will differ from the known current, allowing for the detection of short circuit 401. In some configurations of backplane array 102, the presence of short circuits 201, 301, and 401 causes the current draw of the backplane array 102 to vary by different amounts. Thus, in addition to detecting the presence of a short circuit, a current measurement can be used to classify whether a defect is similar to short circuits 201, 301, or 401.

Figure 5:
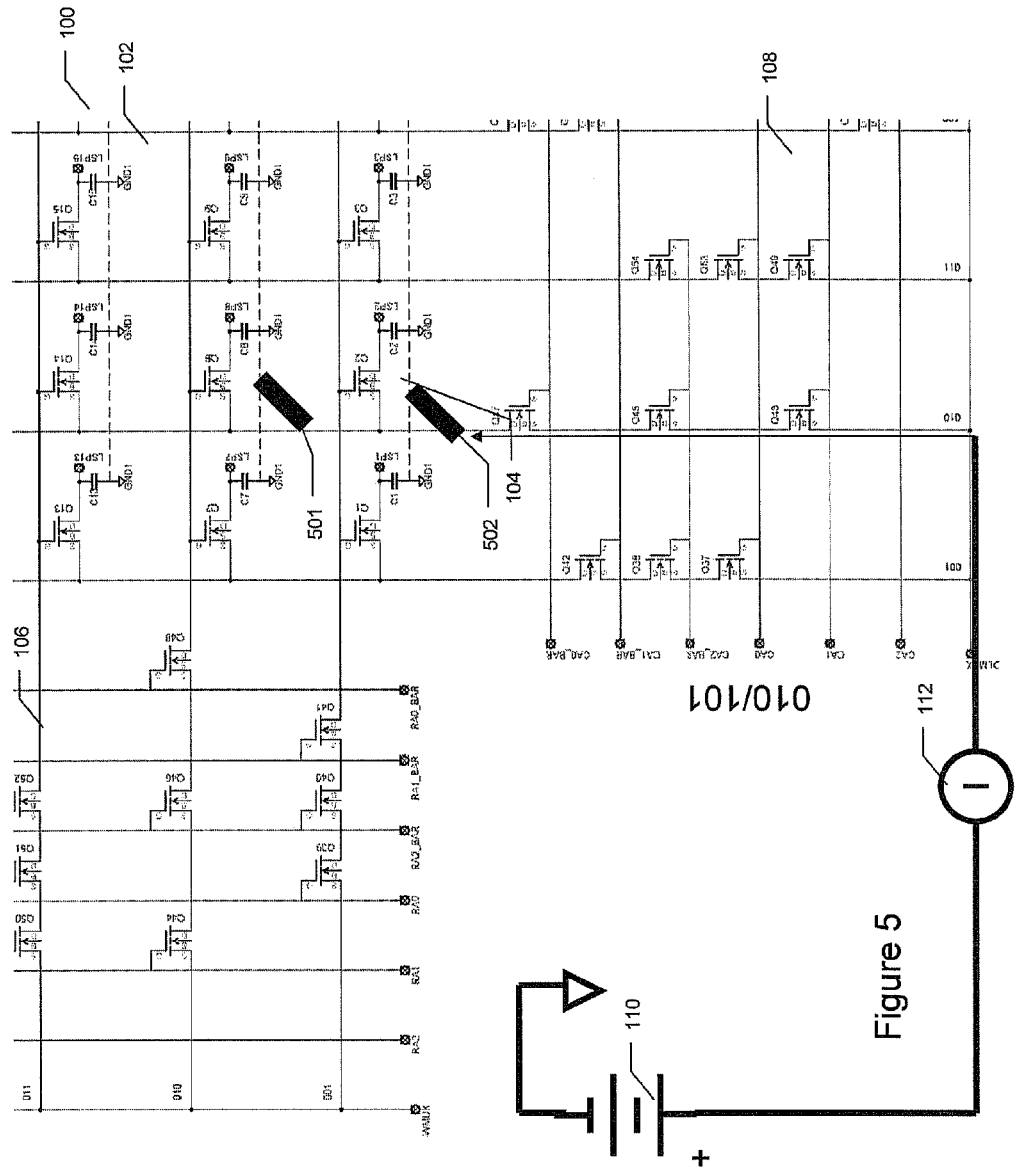

FIG. 5 also depicts the portion of device 100, shown in FIGS. 2, 3, and 4, and comprising backplane array 102, pixel element 104, row decoder 106, column decoder 108, voltage supply 110, and current sensor 112. In FIG. 5, all of the pixel elements in the selected column have been activated, and the total current drawn by all of the activated pixel elements is measured by current sensor 112. As shown in FIG. 5, the backplane array 102 contains two defects, short circuits 501 and 502, which both establish unplanned electrical connections between the column connection and ground. As with short circuits 201, 301, and 401, short circuits 501 and 502 cause the current drawn by the activated pixel elements to deviate from a known or expected current. By comparing the current flowing through current sensor 112, the presence of short circuits 501 and 502 can be detected within backplane array 102. However, because all of the pixels within the column have been activated, the short circuits 501 and 502 cannot be localized to any specific pixels by analysis of the measurements provided by current sensor 112.

Figure 6:
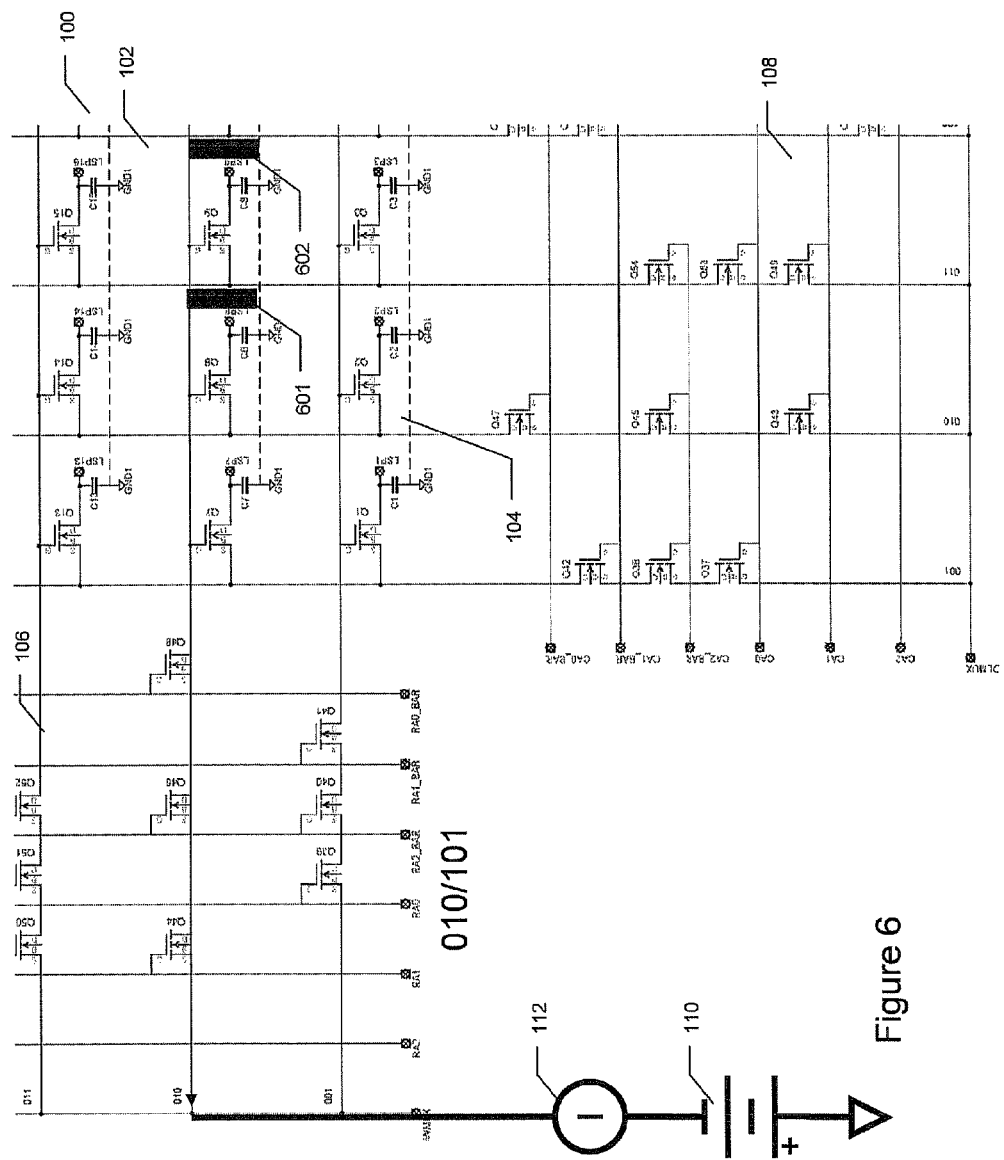

Like FIG. 5, FIG. 6 depicts a portion of device 100, comprising backplane array 102, pixel element 104, row decoder 106, column decoder 108, voltage supply 110, and current sensor 112. In the configuration shown in FIG. 6, all of the pixel elements in a selected row of backplane array 102 are activated, and the activated pixel elements draw an electrical current, which can be detected and measured with current sensor 112. Short circuits 601 and 602 are present in two of the pixel elements of the selected row, and both establish electrical connections between the row connection of the selected row and ground. When the selected row is activated, short circuits 601 and 602 cause the current drawn by backplane array 102 to deviate from a known current. Such a deviation can be detected and measured by current sensor 112. As with short circuits 501 and 502, shown in FIG. 5, short circuits 601 and 602 are shown as the same type of defect. However, because all of the pixels within the row have been activated, the short circuits 601 and 602 cannot be localized to any specific pixels by analysis of the measurements provided by current sensor 112.

Figure 7:
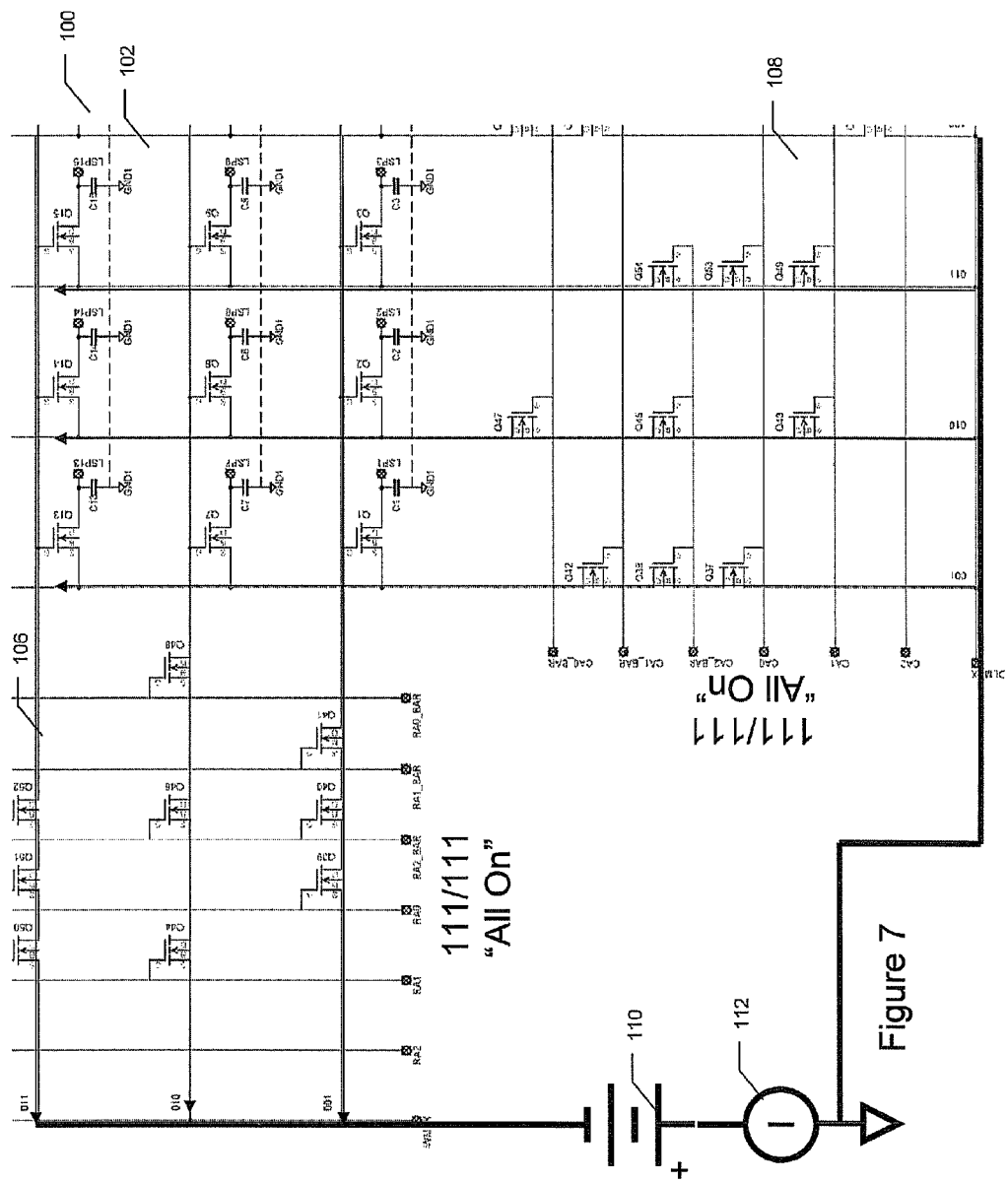
Figure 8:
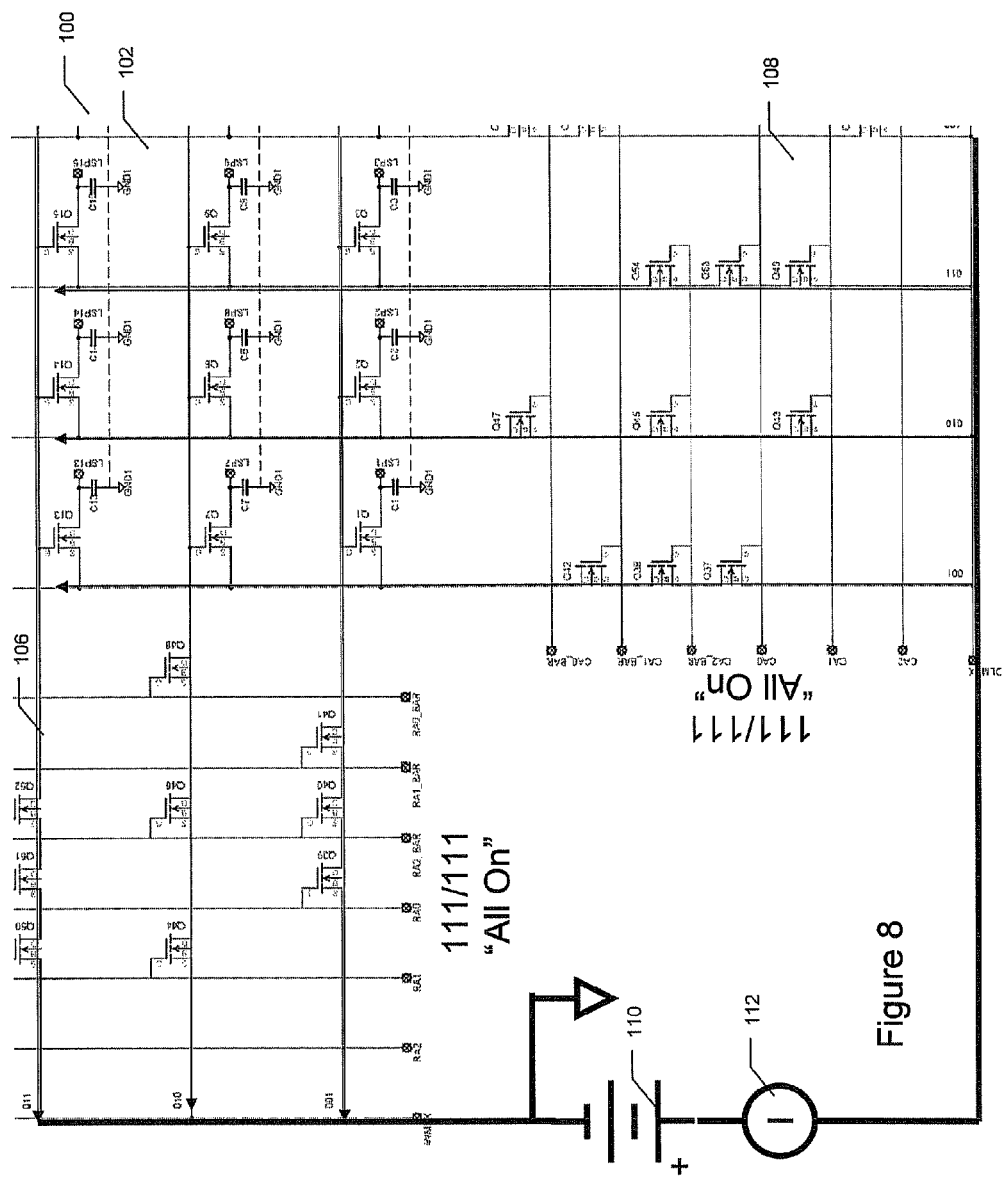
Figure 9:
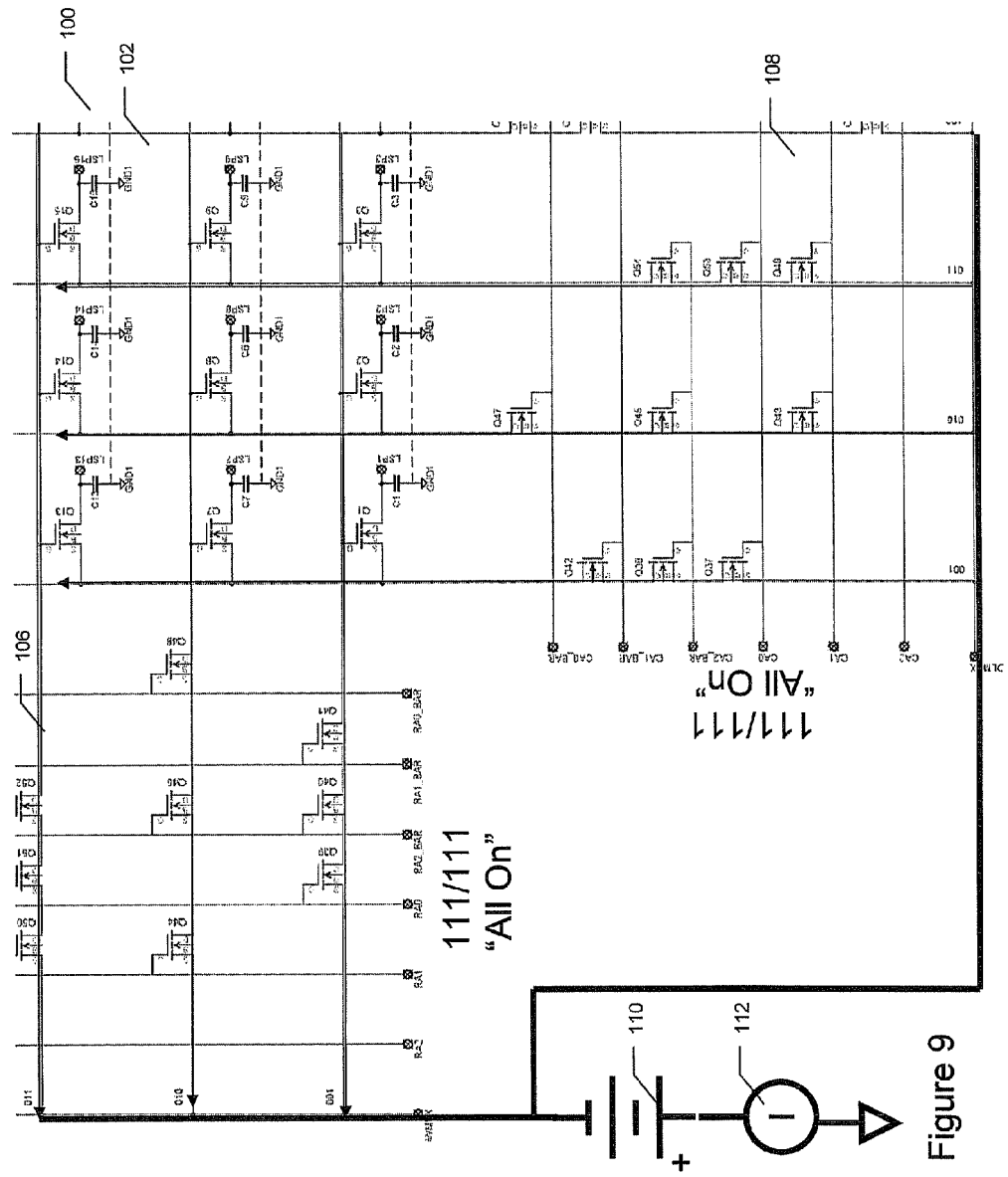

FIGS. 7-9 depict three different configurations of voltage supply 110 and current sensor 112 that may be used during macro-level tests of backplane array 102 in device 100, wherein decoders 106 and 108 are set to activate all of the pixel elements in backplane 102. In FIG. 7, one node of the current sensor 112 is electrically connected to ground and to the column decoder 108. A second node of the current sensor 112 is electrically coupled to the positive terminal of the voltage supply 110, and the negative terminal of the voltage supply is electrically coupled to the row decoder 106. In FIG. 8, the connection to ground is moved from the node comprising the current sensor 112 and the column decoder 108, and is instead established at the node comprising the negative terminal of the voltage supply 110 and the row decoder 106. In FIG. 9, a first node of current sensor 112 is connected to ground, and a second node of current sensor 112 is connected to the positive terminal of voltage supply 110. The negative terminal of voltage supply 110 is connected to both row decoder 106 and column decoder 108. Collectively, FIGS. 7-9 depict three exemplary configurations of current sensor 112 and voltage supply 110, which can be used to draw current through backplane array 102. In each of these configurations, the current detected by current sensor 112 can be compared to a known value, and used to diagnose defects within backplane array 102.

Figure 10:
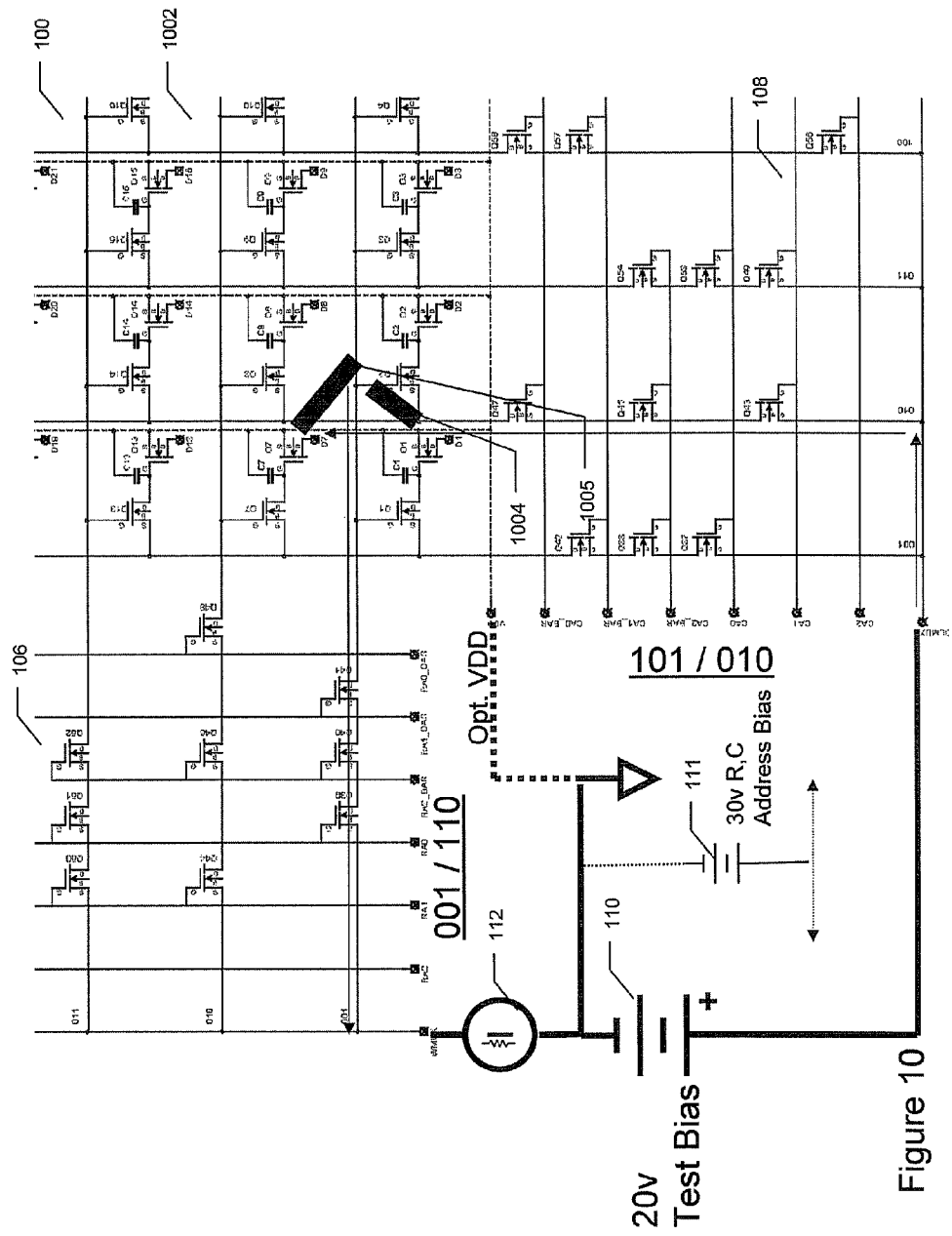
FIGS. 10-16 depict schematic diagrams of example configurations of a device for testing a thin-film transistor backplane array in accordance with a second embodiment of the invention.

FIG. 10 depicts an alternate arrangement of device 100, including row and column decoders 106 and 108, wherein backplane array 102 has been replaced with backplane array 1002, which may be used to drive an organic light emitting diode (OLED) display. Further, an in addition to test bias supply 110, an additional address bias supply 111 is depicted in FIG. 10. Additional address bias supply 111 is shown to operate at a different electrical potential than test bias supply 110, illustrating another aspect of the present invention: By operating additional address supply 111 at a higher electrical potential than test bias supply 110, it is possible to operate ("overdrive") the decoders 106 and 108 in such a way as to reduce the amount of electrical resistance they add to device 100, thereby simplifying the electrical testing of device 100. Although operation at higher electrical bias could eventually be destructive to the transistors comprising decoders 106 and 108, the damage can be acceptable in those situations where the decoders are intended to be detached from the backplane array 1002 upon completion of the desired tests. The operation of the test bias supply 110 at a lower supply potential than the address supply 111 ensures that the transistors comprising the backplane array 1002 are not operated in a manner which unacceptably degrades their performance.

Defect 1004 is a short circuit present between the gate and source terminals of one of the transistors in array 1002, and defect 1005 is a short circuit between the addressed column line in array 1002 and the addressed row line in array 1002. If either or both of defect 1004 or defect 1005 is present in an addressed row and/or column, the current detected by current sensor 112 will deviate from a known or expected value, indicating the presence of a defect within the backplane array 1002. The notation "Opt. VDD" indicates that the VDD connection within the array can optionally be coupled to the indicated ground terminal, or left floating. Skilled artisans will appreciate that electrical paths responsive to defects coupling the VDD lines within the array to other elements of the array will be introduced by the "Opt. VDD" connection.

Figure 11:
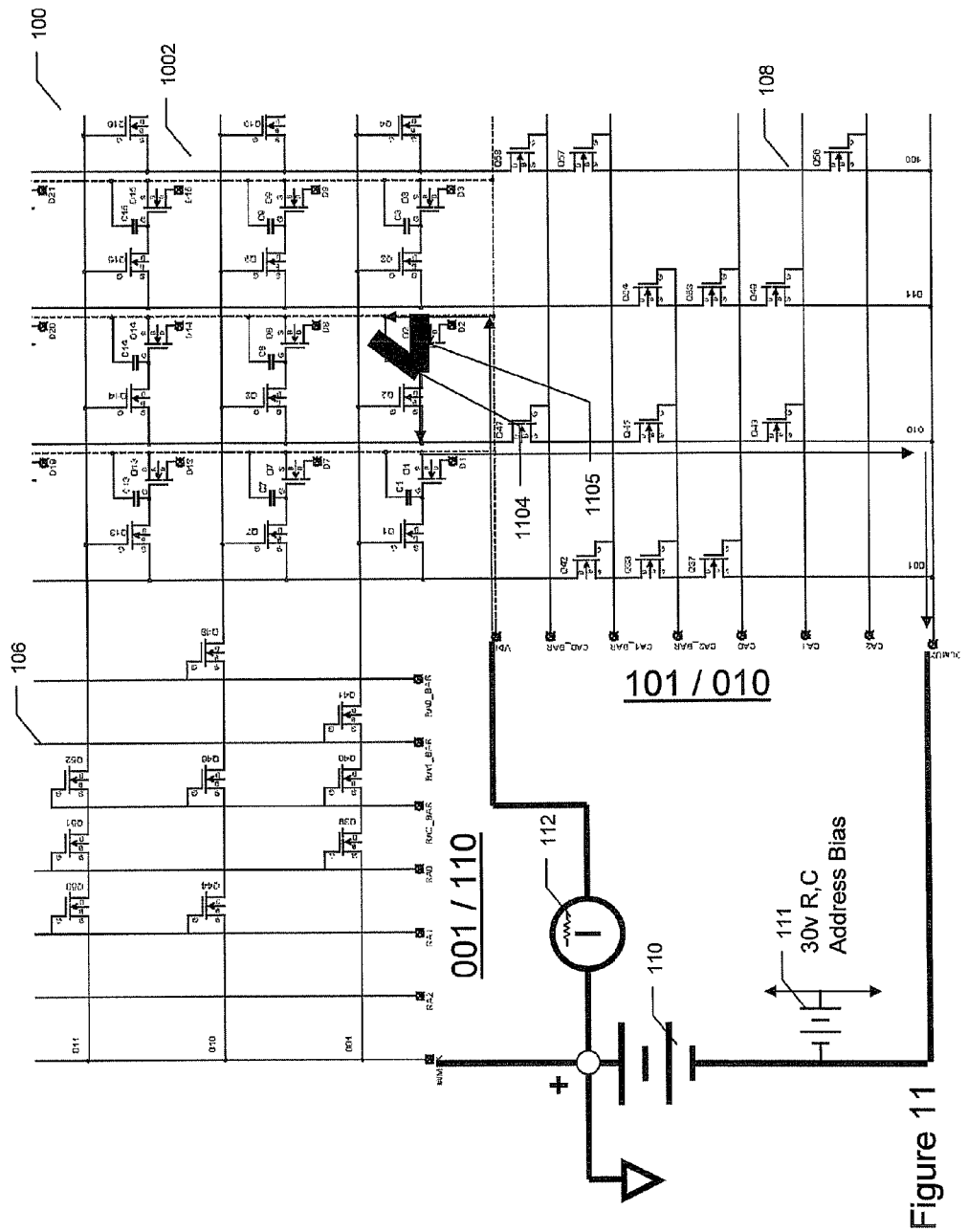

FIG. 11 depicts two additional defects detectable by device 100. Defect 1104 is a short circuit across a capacitor in an addressed pixel element of array 1002, and defect 1105 is a short circuit between the gate and the source of one of the transistors within the addressed pixel elements. The presence of either of these defects causes the current detected by current sensor 112 to deviate from an expected value, permitting the detection of the defects within the array 1002.

Figure 12:
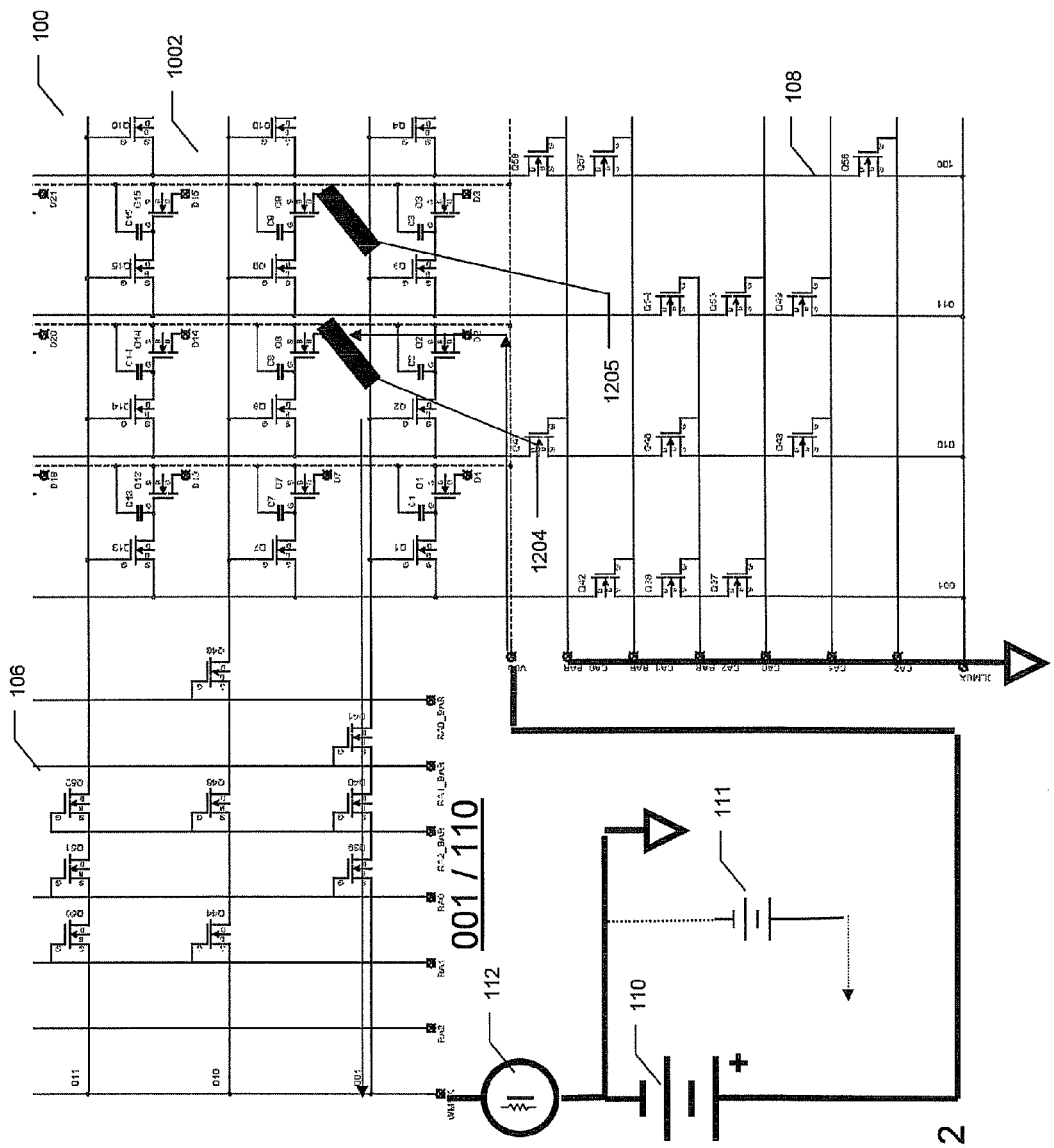

In FIG. 12, all of the pixel elements in one of the rows of array 1002 have been activated by decoders 106 and 108. As depicted in FIG. 12, defects 1204 and 1205 are short circuits between the sources of transistors with array 1002 and the addressed row in array 1002. as with the other defects described herein, the presence of defect 1204 and/or defect 1205 causes the current drawn by the array 1002 to deviate by an amount that can be detected by current sensor 112. Analogous to the descriptions provided supra in regard to FIG. 6, the configuration shown in FIG. 12 is limited to detection of any of the defects 1204 and 1205 without localization to a specific pixel in the row selected.

Figure 13:
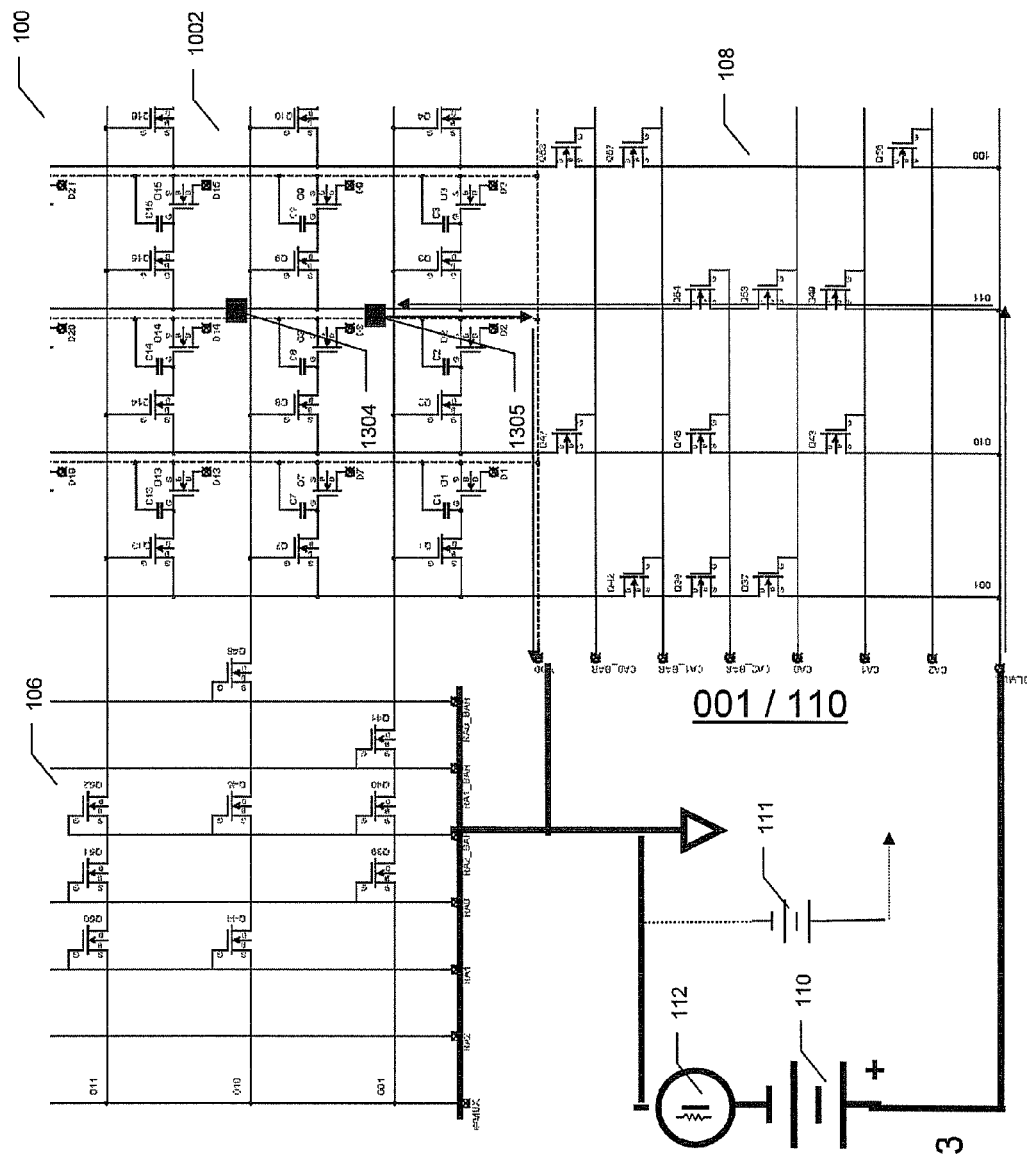

In FIG. 13, all of the pixel elements in one of the columns in array 1002 have been addressed by decoders 106 and 108. As depicted in FIG. 13, defects 1304 and 1305 are short circuits between the addressed column line and VDD. As with the other defects described herein, the presence of defect 1304 and/or defect 1305 causes the current drawn by the array 1002 to deviate by an amount that can be detected by current sensor 112, indicating the presence of the defects 1304 and/of 1305. Analogous to the descriptions provided supra in regard to FIG. 5, the configuration shown in FIG. 13 is limited to detection of any of the defects 1304 and 1305 without localization to a specific pixel in the row selected.

Figure 14:
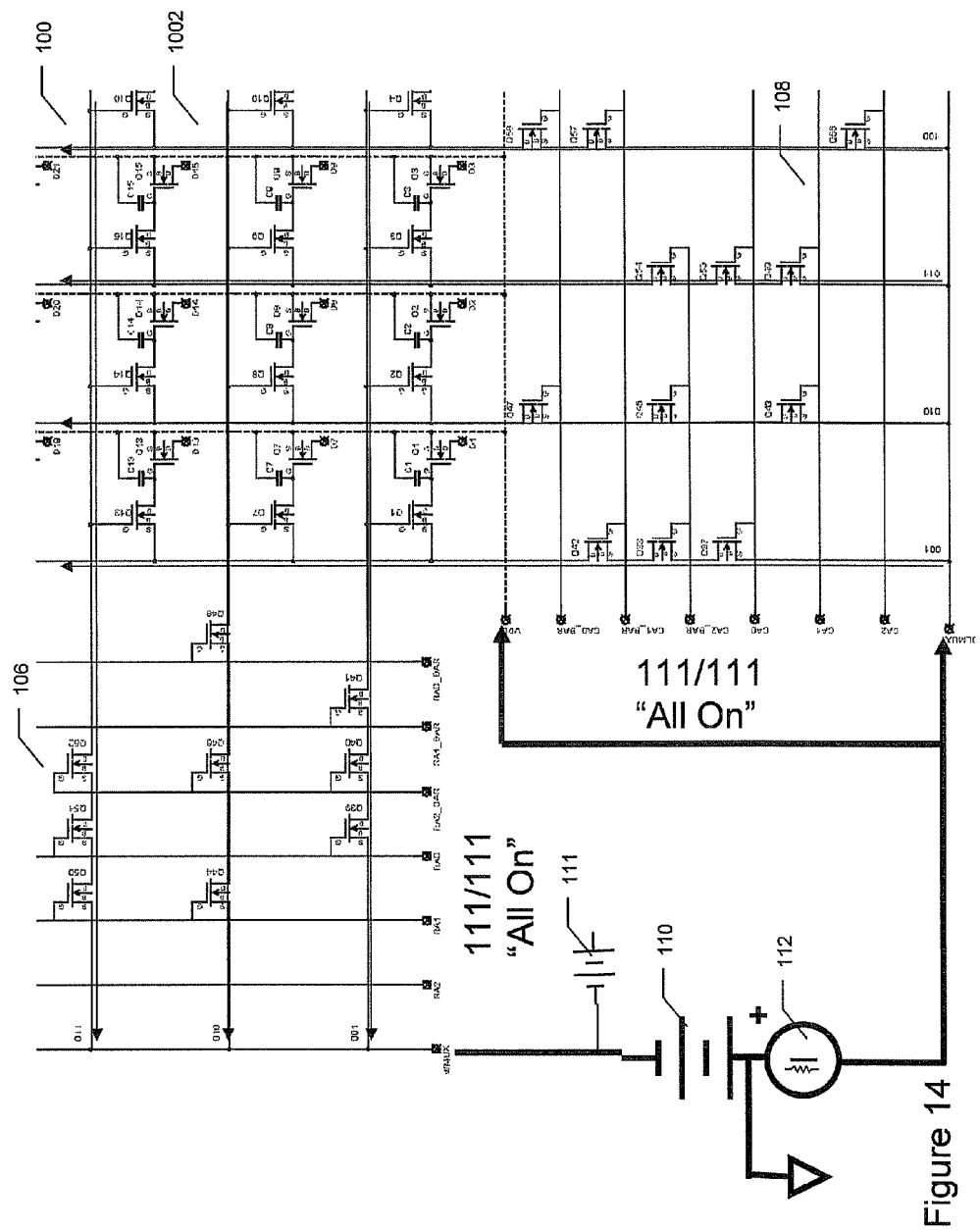
Figure 15:
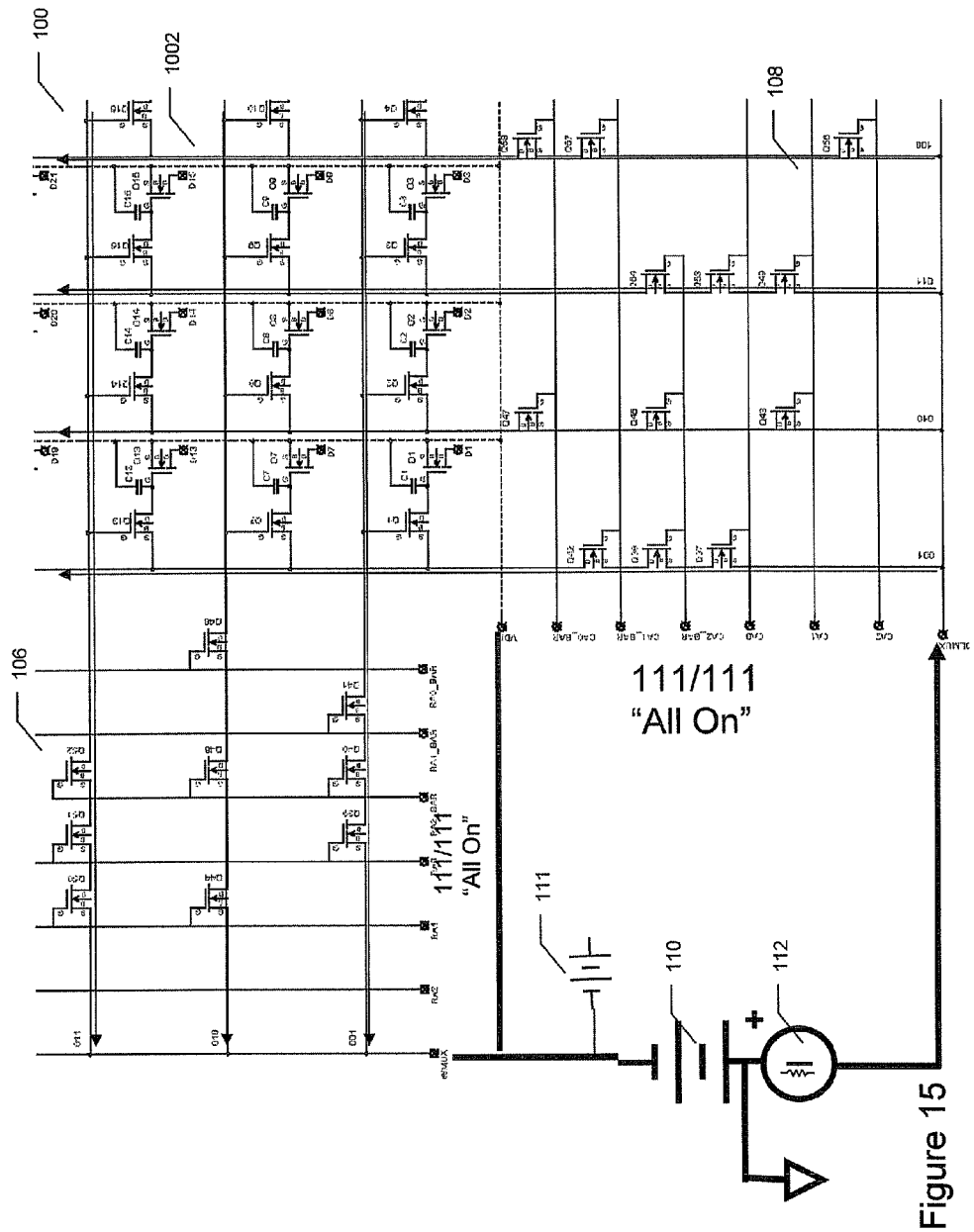
Figure 16:
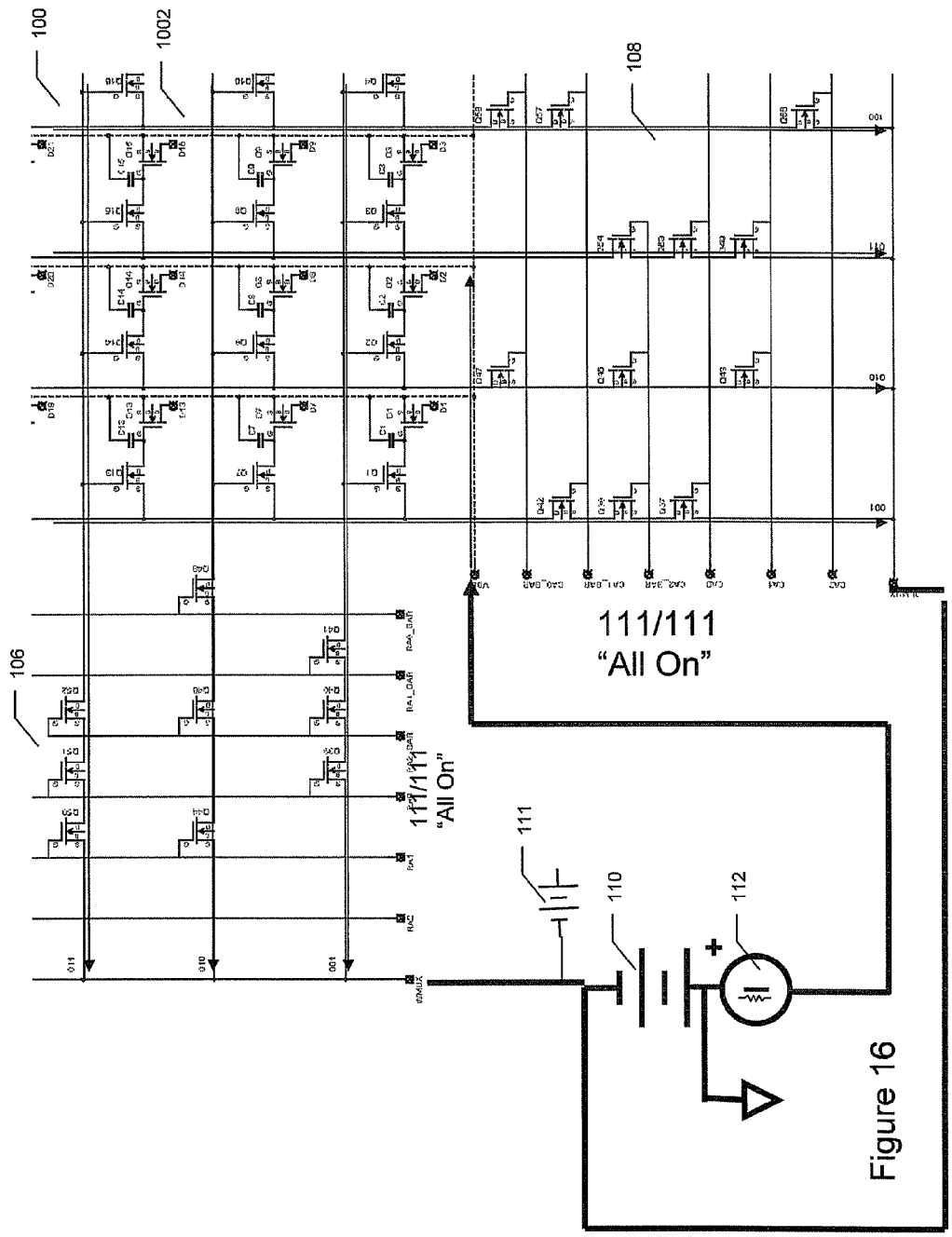

FIGS. 14-16 depict three exemplary configurations that can be used to test all of the transistors within array 1002. In each of FIGS. 14-16, decoders 106 and 108 have been activated to address all of the rows and all of the columns in array 1002. As shown in FIGS. 14-16, numerous different configurations of bias supply 110, address supply 111 and current sensor 112 can be implemented to direct electrical currents through the array 1002 in different directions and at different magnitudes. By comparing the current measurements provided by current sensor 112 to known or expected values, the configurations shown in FIGS. 14-16 can be used to provide a macro-level assessment of the functionality of the array 1002, and can be used to ascertain whether defects exist within the array 1002.

Figure 17:
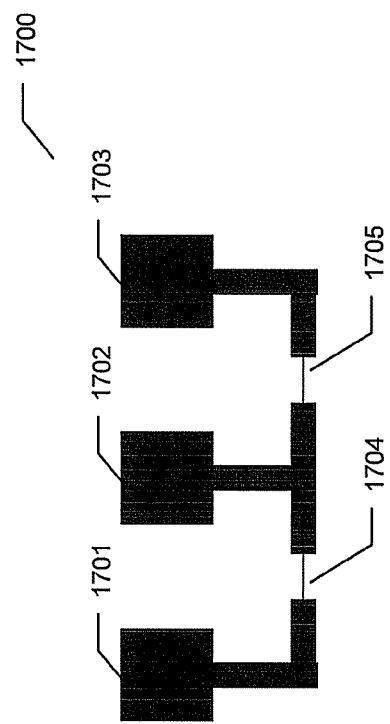
FIG. 17 depicts a diagram of a three-terminal fuse structure for protecting a thin-film transistor backplane array from electric discharges in accordance with a third aspect of the invention

FIG. 17 depicts an example configuration of a three-terminal fuse device 1700. Device 1700 comprises three electrical contacts 1701, 1702 and 1703. Electrical contact 1701 is electrically coupled to electrical contact 1702 through fuse 1704, and electrical contact 1702 is electrically coupled to electrical contact 1703 through fuse 1705. In the absence of a current or voltage in excess of the rating of fuse 1704 or 1705, the fuses remain intact, and establish electrical connections between the electrical contacts 1701-1703. However, if a current or voltage in excess of the rating of fuse 1704 or 1705 is present at fuse 1704 and/or 1705, one or both of the fuses may singulate, and break one or more of the electrical connections between electrical contacts 1701-1703.

Figure 18:
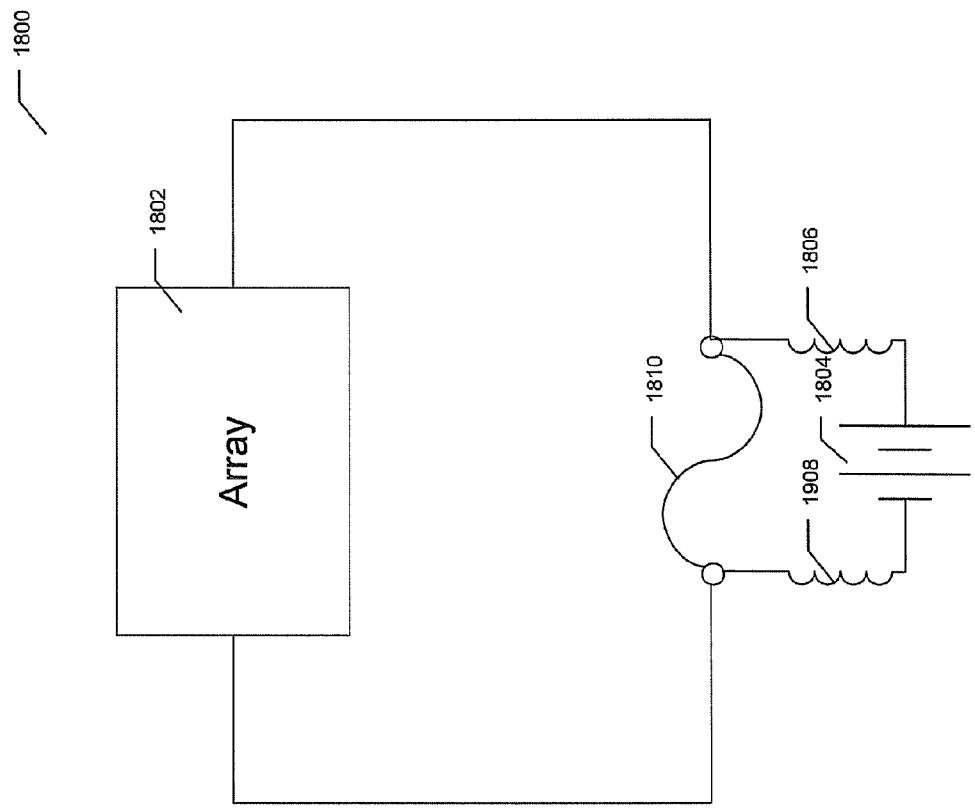
FIG. 18 depicts a schematic diagram of a fuse device for protecting a thin-film transistor backplane array from electric dischargers

FIG. 18 depicts a diagram of system 1800 that incorporates a two-terminal fuse 1810. In system 1800, portions of thin-film transistor backplane array 1802 are electrically coupled to separate terminals of fuse 1810. One terminal of fuse 1810 is electrically coupled to one terminal of power supply 1804 through inductor 1806, and the other terminal of fuse 1810 is electrically coupled to the other terminal of power supply 1804 through inductor 1808. During the manufacturing, processing, and initial handling of thin-film transistor backplane array 1802, power supply 1804 and inductors 1806 and 1808 are not connected, and fuse 1810 acts to protect the array from damage due to the accidental application of high currents or voltages or the discharge of static electricity. In some test configurations, the fuse needs to be removed in order to sever the connection between portions of array 1802 that are electrically coupled via fuse 1810. To open the fuse, the power supply 1804 is coupled to the fuse via inductors 1806 and 1808. If the power supplied by power supply 1804 exceeds the rating of the fuse, the fuse opens, and the connection between portions of array 1802 is severed.

Figure 19:
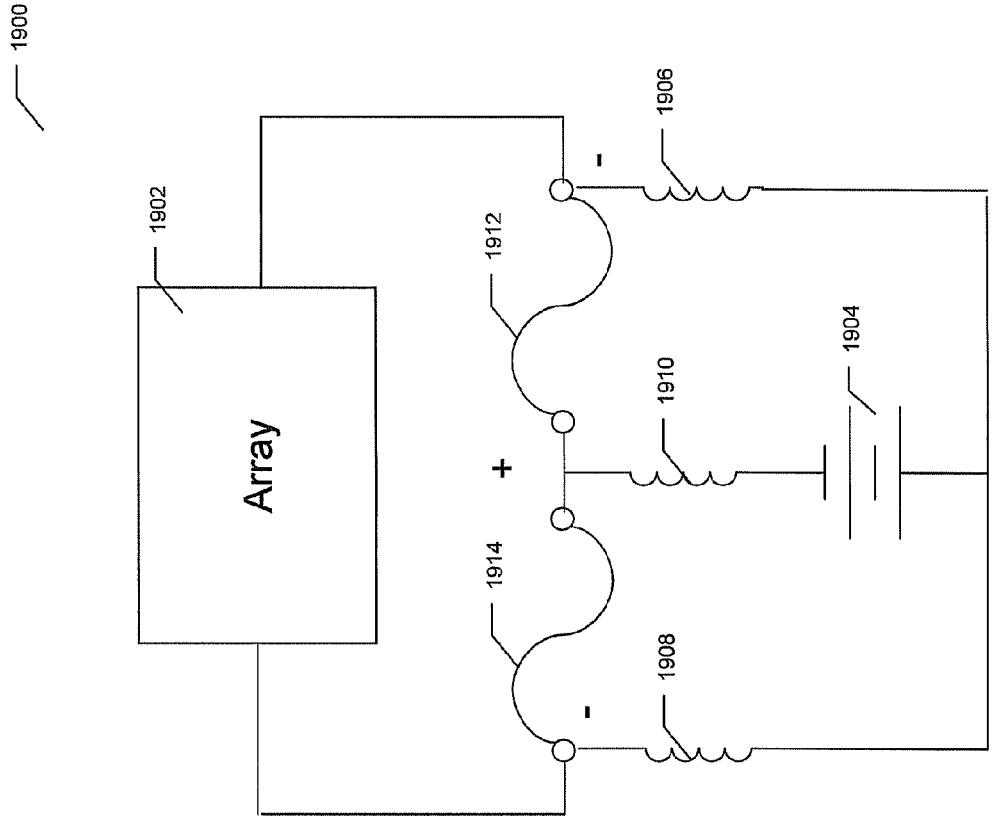
FIG. 19 depicts an example configuration of a fuse device incorporating the three-terminal fuse structure depicting in FIG. 17.
Figure 20A:
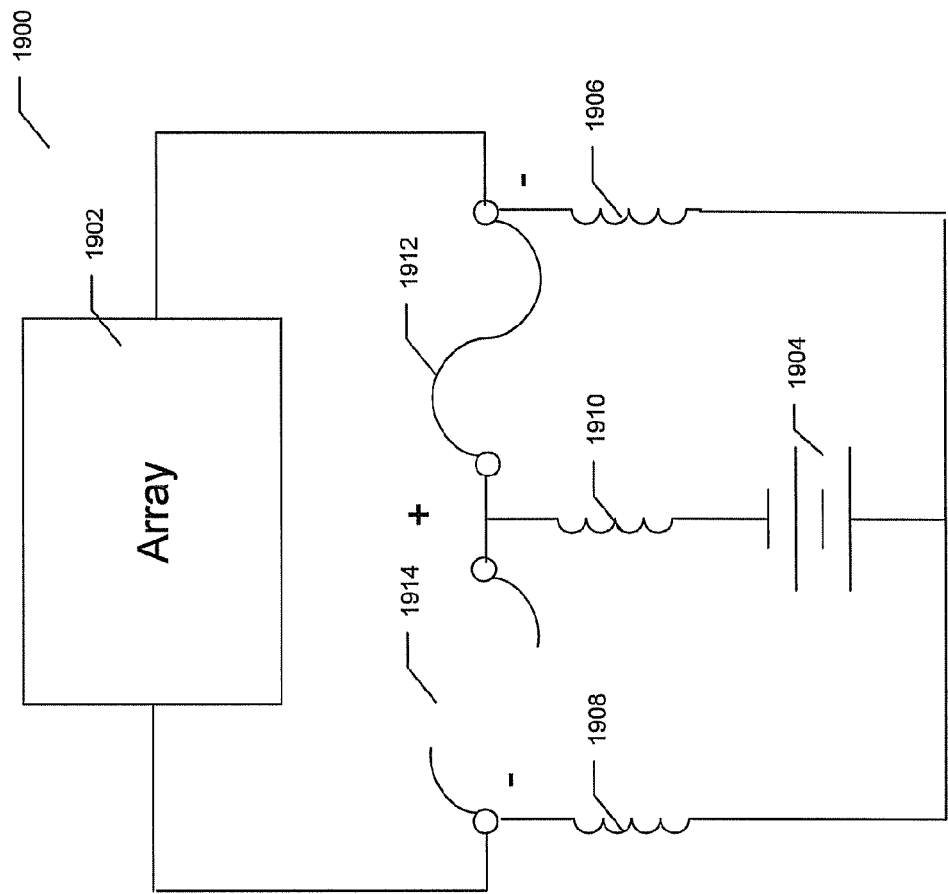
FIGS. 20A and 20B depict a series of block diagrams of an implementation of a three-terminal fuse structure to protect a thin-film transistor array from electric discharges.
Figure 20B:
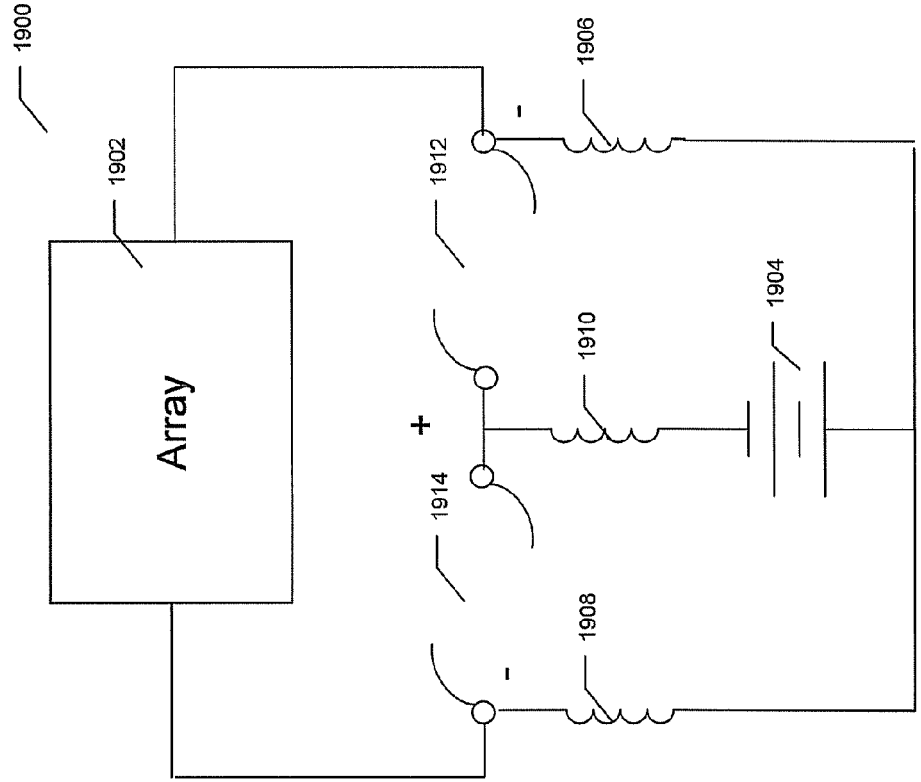

FIGS. 19 and 20a-20b are a series of diagrams depicting system 1900, which uses a three-terminal fuse arrangement that can be used to protect a thin-film transistor backplane array 1902 from damage due to the accidental discharge of electricity and from damage due to the application of electricity used to open the fuses in advance of a test procedure. During the manufacturing, processing, and handling of the array 1902, power supply 1904 and inductors 1906, 1908 and 1910 are not connected, and fuses 1912 and 1914 act to protect the array from damage due to the accidental application of electricity or the discharge of static electricity. In some test configurations, fuses need to be removed before the test can be performed.

To remove the fuses, power supply 1904 and inductors 1906, 1908 and 1910 are used to apply power in excess of the rating of the fuses to fuses 1914 and 1912. As shown in FIG. 19, one terminal of power supply 1904 is connected to one terminal of fuse 1912 via inductor 1906 and is also connected to one terminal of fuse 1914 through inductor 1908. The other terminal of power supply 1904 is coupled via inductor 1910 to the node formed by the electrical connection between fuses 1912 and 1914.

When a sufficient amount of power is applied, one of fuses 1912 and 1914 will open, as depicted in FIG. 20a. As a result, the full power from power supply 1904 will be applied across the remaining fuse, shown as fuse 1912 in FIG. 20a, and open, as shown in FIG. 20b. In this configuration, the full power of the power supply used to open fuses 1912 and 1914 is never applied to the thin-film transistor backplane array 1902, and thus reduces the likelihood of damage occurring during the fuse removal process.

In the following discussions of FIGS. 21-23, it will be appreciated by those skilled in the art that mosfet transistors may be configured as symmetrical devices, and consequently, the interchange of terminals named source and drain may have no effect on the operation of the device. In conventional nomenclature, a conventional electrical current is presumed to flow into the source terminal of a PMOS transistor, and out from the source terminal of an NMOS transistor. However, in some applications and configurations, such as a passgate, control current may flow in both directions through the devices comprising a particular configuration. Thus, while the terms source and drain are applied in the discussion of FIGS. 21-23, it is to be understood that the application of the terms is not intended as limiting with respect to the direction of current through a device. Rather, the direction of current is to be understood on the basis of the bias potential applied to the device terminals.

Figure 21:
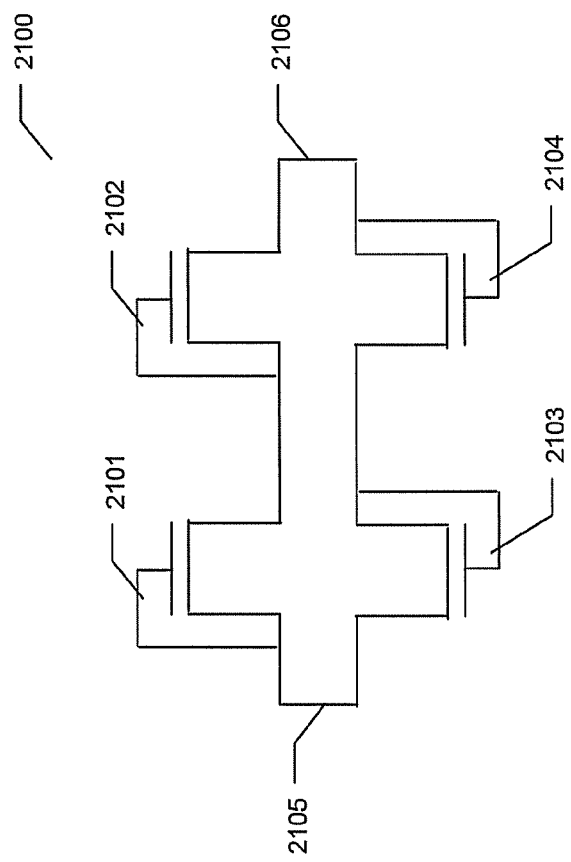
FIG. 21 depicts a schematic diagram of a first electrostatic discharge protection device for protecting a thin-film transistor backplane array from electric discharges.

FIG. 21 depicts an example electrostatic discharge protection device 2100 that comprise four transistors 2101-2104. As shown in FIG. 21, transistors 2101-2104 are field-effect transistors. The drain of transistor 2101 is electrically coupled to the source of transistor 2102, and the gate of transistor 2102 is electrically coupled to the node formed by the connection of the drain of transistor 2101 and the source of transistor 2102. Similarly, the drain of transistor 2102 is electrically connected to both the source of transistor 2104 and the gate of transistor 2104. The drain of transistor 2104 is electrically connected to both the source and gate of transistor 2103, and the drain of transistor 2103 is electrically connected to the source and the gate of transistor 2101.

In an exemplary use of electrostatic discharge protection device 2100, node 2105, which is formed by the connection of the gate and source of transistor 2101 and the drain of transistor 2103, is electrically connected to a first portion of a circuit. Node 2106, which is formed by the connection of the drain of transistor 2102 and the gate and source of transistor 2104, is connected to a second portion of the circuit. In the absence of a voltage or current in excess of the rating of electrostatic discharge protection device 2100, the device 2100 does not allow electrical signals to flow from node 2105 to node 2106. However, if a voltage in excess of the rating of electrostatic discharge protection device 2100 is applied across nodes 2105 and 2106, the device 2100 allows electrical signals to flow between node 2105 and 2106, and placing nodes 2105 and 2016 at approximately the same electrical potential.

In another example implementation of electrostatic discharge device 2100, the transistor geometries for each of transistors 2101-2104 are configured to control the order in which the transistors 2101-2104 break down and conduct electricity when subjected to a voltage or current. In one example implementation, transistor 2101 is constructed such that the ratio of the channel width of transistor 2101 to the channel length of transistor 2101 is greater than one. Transistor 2101 may also be configured such that the channel length of transistor 2101 is less than a standard channel length of the transistors within an array. Transistor 2102 may be constructed such that the ratio of its channel width to its channel length is less than one, and that its channel length is longer than a standard channel length. In this example configuration, transistor 2104 may be sized similarly to transistor 2101 and transistor 2103 may be sized similarly to transistor 2102. By sizing the transistors differently, the transistors break down under different conditions and at different voltages.

Figure 22:
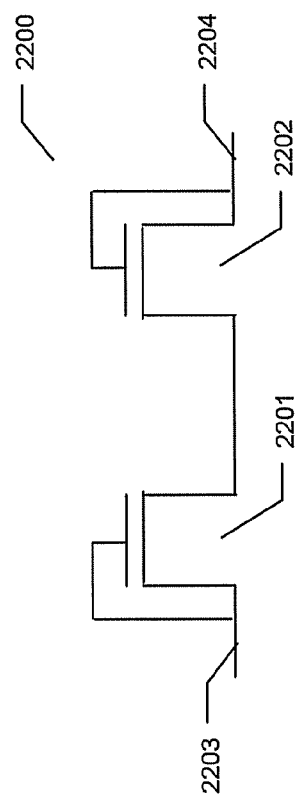
FIG. 22 depicts a schematic diagram of a second electrostatic discharge protection device for protecting a thin-film transistor backplane array from electric discharges.

FIG. 22 depicts a second exemplary electrostatic discharge protection device 2200, comprising transistors 2201 and 2202, which are field-effect transistors. As shown in FIG. 22, the drain of transistor 2201 is electrically coupled to the source of transistor 2202. Further, the gate of transistor 2201 is electrically coupled to the source of transistor 2201 to form node 2203, and the gate of transistors 2202 is electrically coupled to the drain of transistor 2202, to form node 2204.

In an exemplary use of electrostatic discharge protection device 2200, node 2203 is electrically connected to a first portion of a circuit and node 2204 is connected to a second portion of the circuit. In the absence of a voltage or current in excess of the rating of electrostatic discharge protection device 2200, the device 2200 does not allow electrical signals to flow from node 2203 to node 2204. If a voltage in excess of the rating of electrostatic discharge protection device 2200 is applied across nodes 2203 and 2204, the device 2200 establishes an electrical connection between the nodes 2203 and 2204, placing the two nodes 2203 and 2204 at approximately the same electrical potential.

In an example use of device 2200, a bias is applied across nodes 2203 and 2204 such that those skilled in the art would consider node 2203 to be a negative terminal and node 2204 to be a positive terminal. In this example use, transistor 2201 may be configured such that its channel length is less than a standard length, and its channel width-to-channel length ratio is greater than one. Transistor 2202 may be configured such that its channel length is longer than a standard length, and its channel width-to-channel length ratio is less than one. In this reverse bias case, transistor 2201 will break down at a lower electrical potential, because it has a shorter channel. After transistor 2201 breaks down, transistor 2202 acts as a series resistor and limits the current that can pass through device 2200, which may prevent transistor 2201 from self-destructing in the presence of a high electrical potential.

In another example use of device 2200, a bias is applied across notes 2203 and 2204 such that those skilled in the art would consider node 2203 to be a positive terminal and node 2204 to be a negative terminal. In this configuration, transistor 2201 is in forward bias, and transistor 2202 is in reverse bias. If transistor 2202 is configured such that it has a longer channel and the ratio of its channel width to channel length is less than one, transistor 2202 will resist breakdown, and may prevent leakage current in the system.

Figure 23:
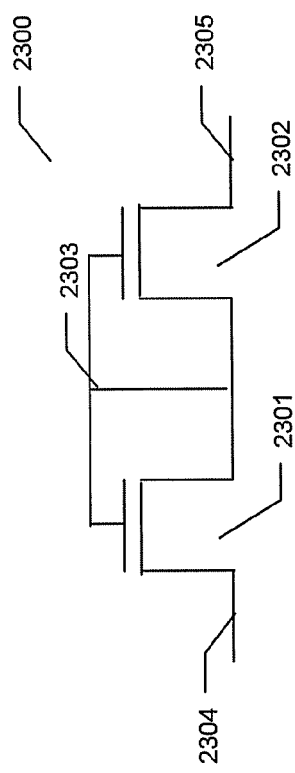
FIG. 23 depicts a schematic diagram of a third electrostatic discharge protection device for protecting a thin-film transistor backplane array from electric discharges.

FIG. 23 depicts a third exemplary electrostatic discharge protection device 2300, comprising transistors 2301 and 2302, which are both field-effect transistors. The drain of transistor 2301 is electrically coupled to the source of transistor 2302. Further, the gate of transistor 2301 and the gate of transistor 2302 are both electrically coupled to the drain of transistor 2301 and the source of transistor 2302, forming node 2303. In an exemplary use of electrostatic discharge protection device 2300, node 2304, which is the source of transistor 2301, is electrically connected to a first portion of a circuit and node 2305, which is the drain of transistor 2302, is connected to a second portion of the circuit. In the absence of a voltage or current in excess of the rating of electrostatic discharge protection device 2300, the device 2300 does not allow electrical signals to flow from node 2304 to node 2305. However, if a voltage in excess of the rating of electrostatic discharge protection device 2300 is applied across nodes 2304 and 2405, the device 2200 establishes an electrical connection between the nodes 2304 and 2305, placing the two nodes 2304 and 2305 at approximately the same electrical potential.

Figure 24:
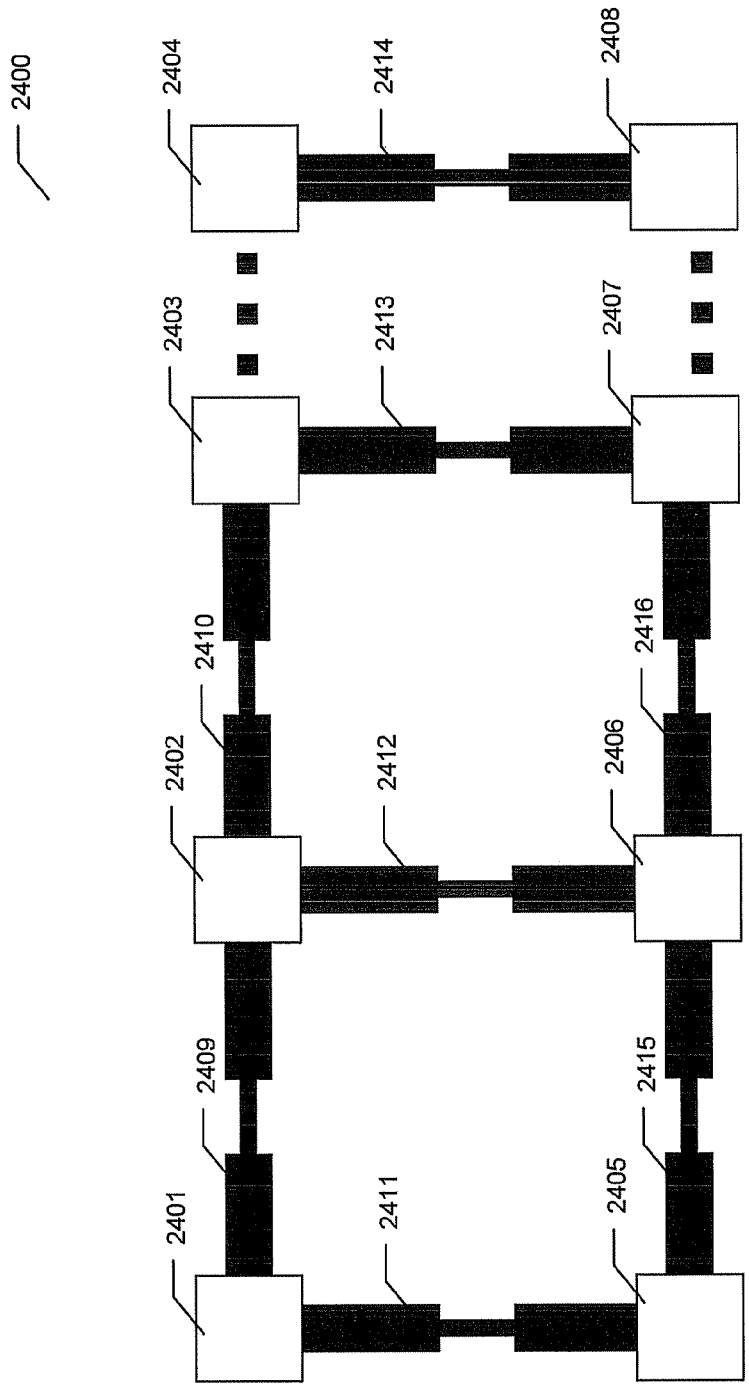
FIG. 24 depicts an example implementation of a plurality of fuses for protecting a thin-film transistor backplane array from electric discharges.

FIG. 24 depicts an exemplary use of fuses to provide protection against electrostatic discharge or other potentially damaging electrical discharges. A portion of a circuit 2400 is shown, comprising electrical contacts 2401-2408. For example, electrical contacts 2401-2408 may be test-pad connections, used to facilitate an electrical connection between a voltage or current sensor and a portion of an electrical circuit, such as a thin-film transistor backplane array. Circuit 2400 also comprises fuses 2409-2416, which establish electrical connections between electrical contacts 2401-2408. While only eight electrical contacts are shown in FIG. 24, any number of electrical contacts can be used and any number of fuses can be used to establish electrical connections between the electrical contacts. Further, while FIG. 24 depicts the use of two-terminal fuses, three terminal fuses, such as those described herein and depicted in FIG. 17, may also be used as fuses 2409-2416. In the configuration depicted in FIG. 24, the fuses 2409-2416 establish electrical connections between all of electrical contacts 2401-2408, placing all of electrical contacts 2401-2408 at approximately the same electrical potential. If a current or voltage in excess of the rating of one of fuses 2409-2416 is present at one of the electrical contacts 2401-2408, at least one of fuses 2409-2416 will singulate, and sever the electrical connection previously established by the fuse.

In an example implementation, the arrangement of fuses 2409-2416 and electrical contacts 2401-2408 may be used to establish electrical connections between all or most of the row and column connections of a thin-film transistor backplane array, and protect the pixel elements in the array from damage due to electrostatic discharges that may occur during the manufacture, movement, and/or assembly.

Figure 25:
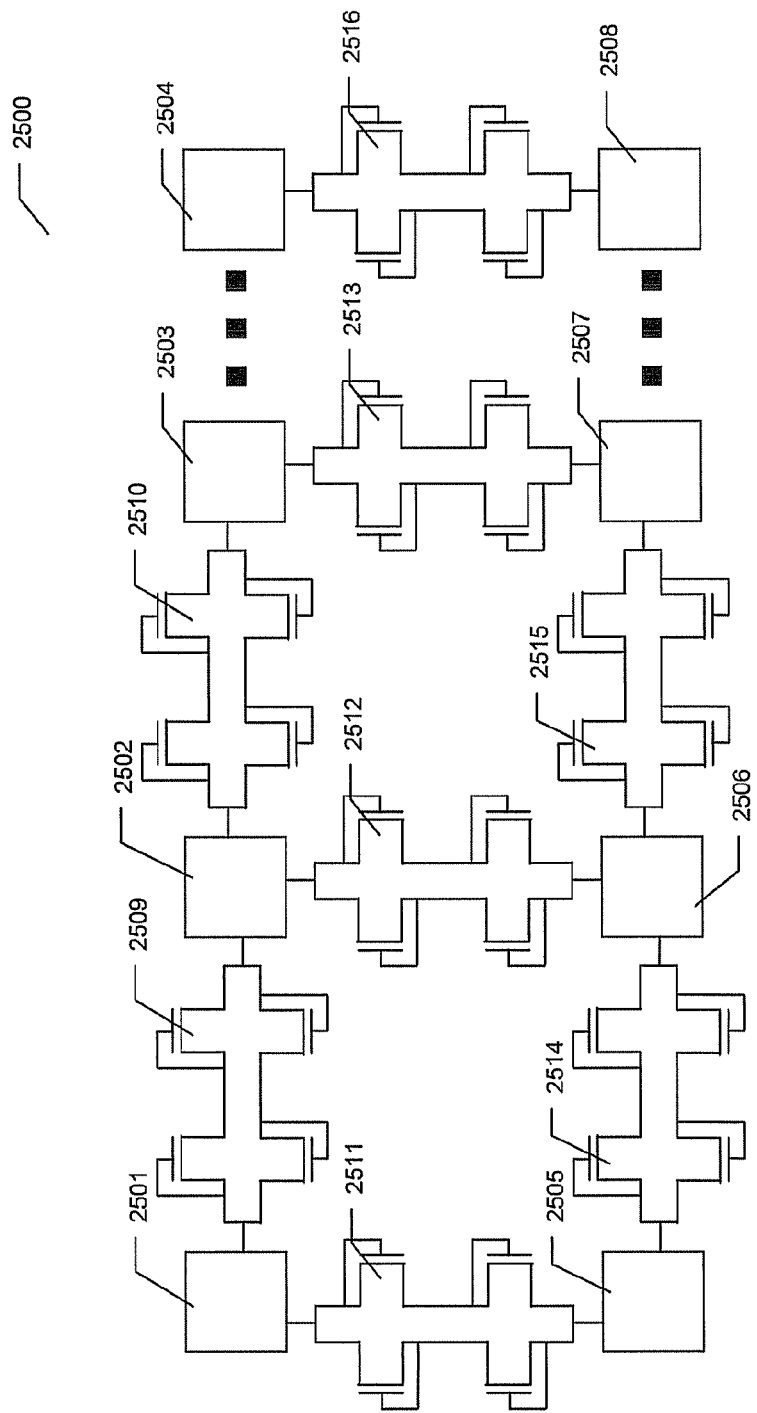
FIG. 25 depicts an example implementation of a plurality of the electrostatic discharge protection devices shown in FIG. 21.

FIG. 25 depicts an arrangement 2500 of electrical contacts 2501-2508 similar to those shown in FIG. 24. However, in FIG. 25, fuses 2409-2416 have been replaced with electrostatic discharge protection devices 2509-2516. As shown in FIG. 25, electrostatic discharge protection devices 2509-2516 are of the type depicted in FIG. 21. As described above, electrostatic discharge protection device 2509-2516 act to establish electrical connections in the presence of a current or voltage in excess of the rating of the device. However, in the absence of an excessive current or voltage, the electrostatic discharge protection devices 2509-2516 do not allow electrical signals to flow through themselves.

In an example implementation, the arrangement of electrical contacts 2501-2508 and electrostatic discharge devices 2509-2516 may be used to protect the pixel elements of a thin-film transistor backplane array during testing. For example, if an excessive current is drawn by one or more transistors within an array, one or more of electrostatic discharge devices 2509-2516 will establish an electrical connection between one or more of electrical contacts 2501-2508, and may divert the excessive current away from array.

Figure 26:
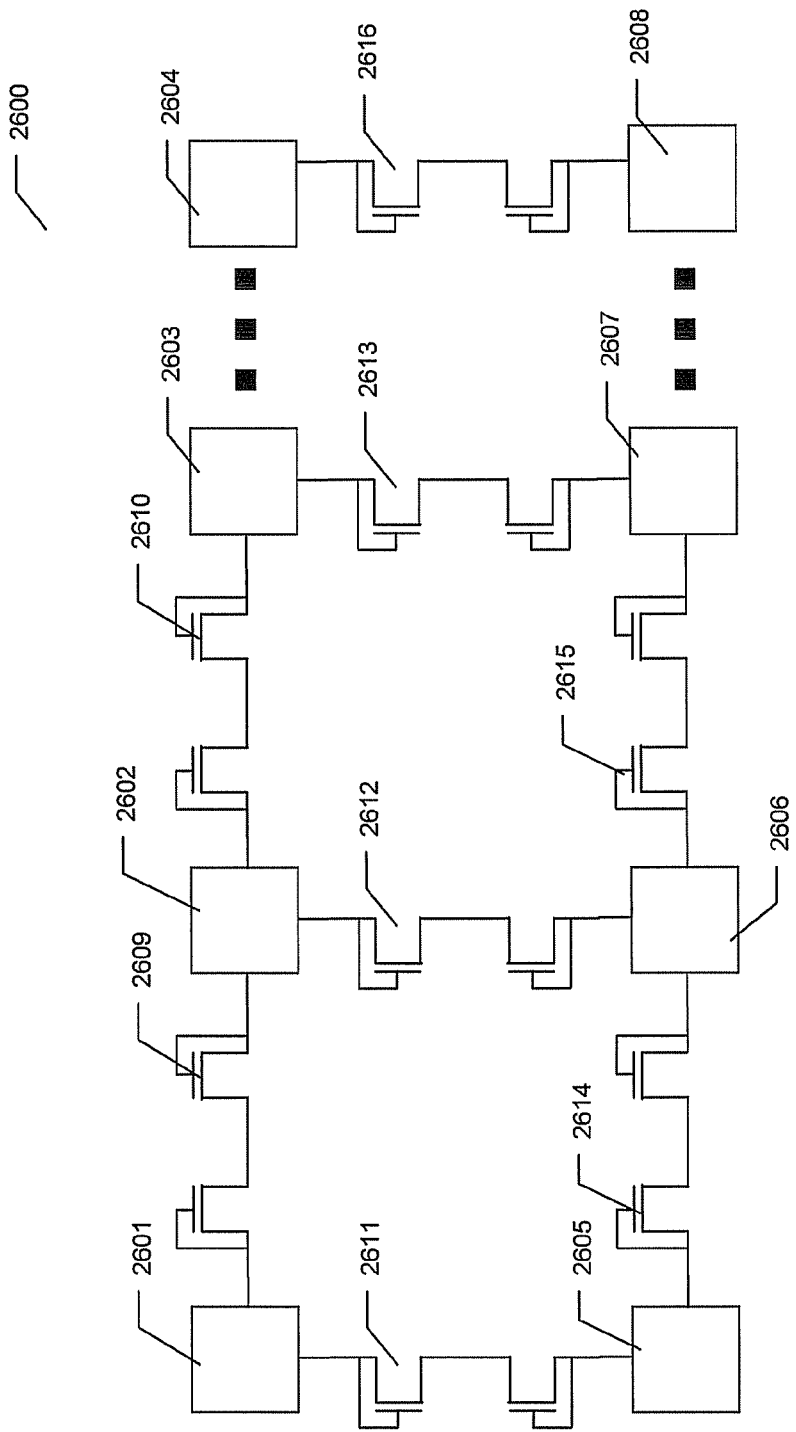
FIG. 26 depicts an example implementation of a plurality of the electrostatic discharge protection devices depicted in FIG. 22.

FIG. 26 depicts an arrangement 2600 that is similar to arrangement 2500 in FIG. 25, wherein electrostatic discharge devices 2609-2616 are of the type described in FIG. 22. Like the arrangement described in FIG. 25, arrangement 2600 may be used to provide protection to an array during testing. However, where the electrostatic discharge devices 2509-2516 in FIG. 25 use four transistors each, the electrostatic discharge devices 2609-2616 use two transistors each.

Figure 27:
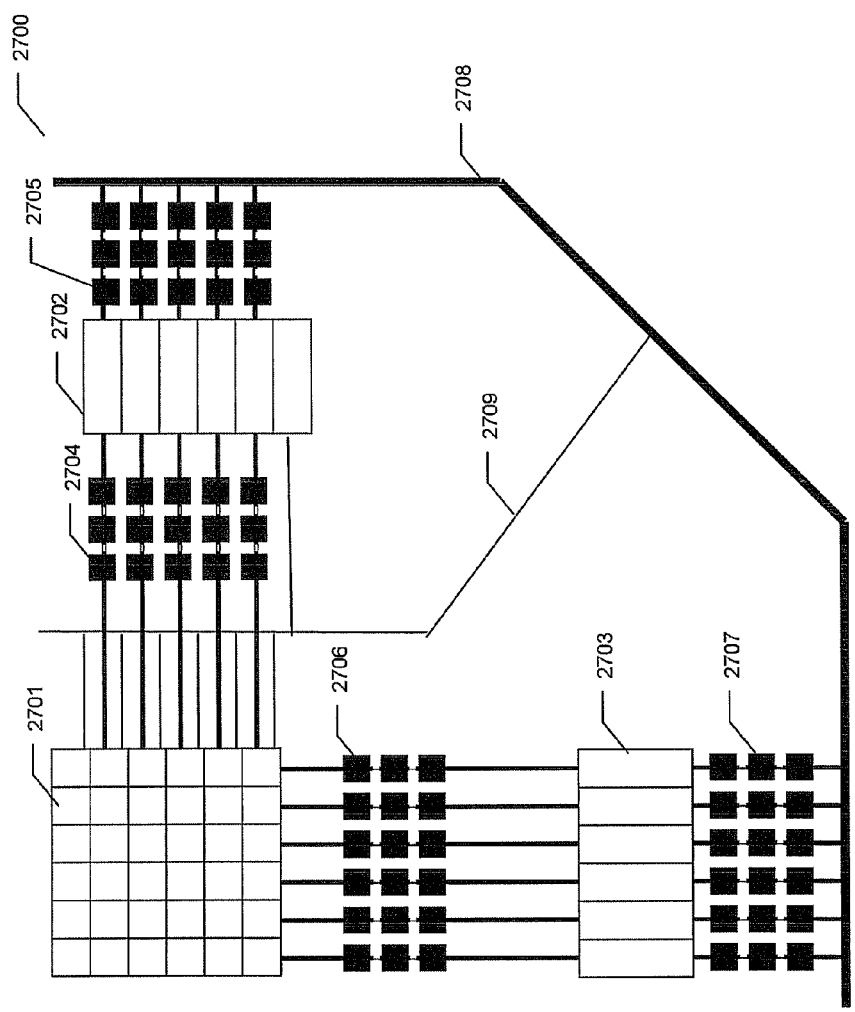
FIGS. 27 and 28 are a sequence of block diagrams depicting an implementation of three-terminal fuses to protect a thin-film transistor backplane array from electric discharges prior to and during testing of the thin-film transistor backplane array.
Figure 28:
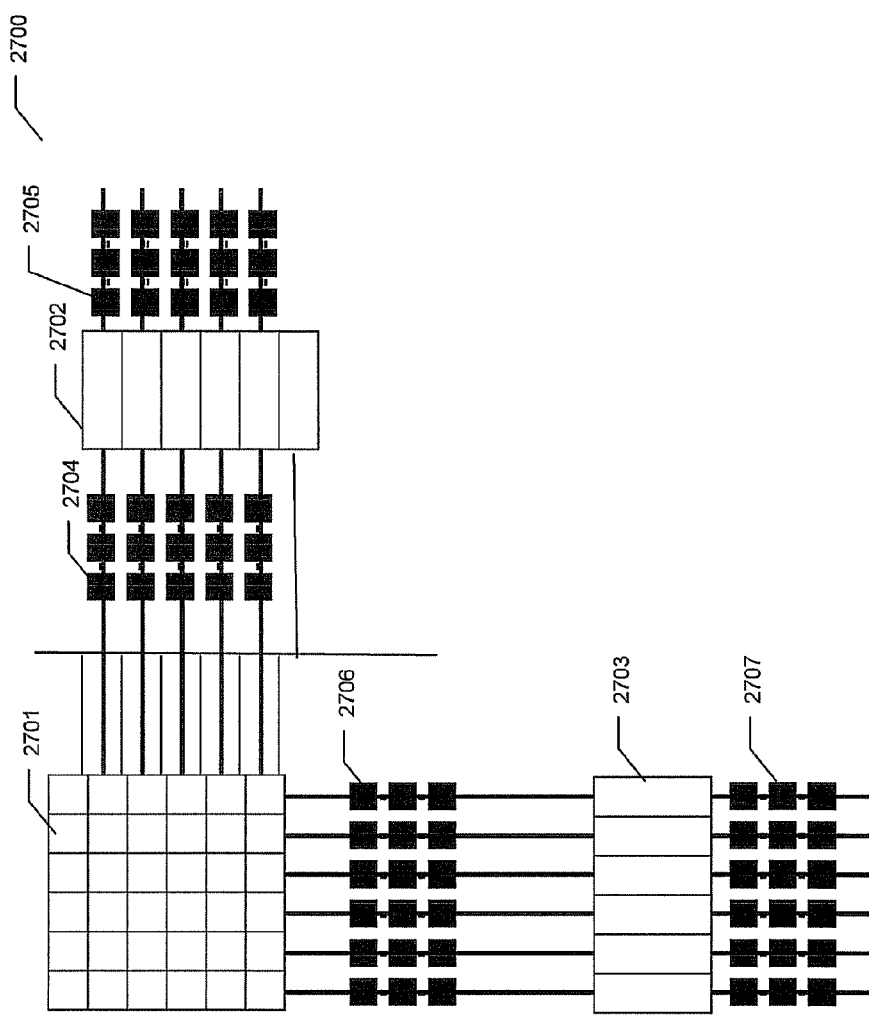

FIGS. 27 and 28 depict an implementation of a device 2700 comprising three-terminal fuses that can be used to protect a backplane array 2701 from electrical discharges during fabrication, handling, and assembly. In device 2700, row connection terminals 2702 are electrically connected to array 2701 through the plurality of three-terminal fuses 2704. In an exemplary embodiment of the present invention, the row connection terminals 2702 are a series of bonding pads which are used for providing an appropriate interface for tab bonding the row connections to an external driving circuit according to techniques well known to those skilled in the art. Alternately, the row connection terminals 2702 may represent connections to the outputs of a decoder circuit as described supra. As shown in FIG. 27, one of the row connection terminals 2702 is directly connected to a plurality of row common terminals leading into array 2701. In one exemplary embodiment of the present invention, this plurality of common terminals is the ground connection for a transistor backplane having a single transistor in each pixel, the backplane further being intended for driving an electrophoretic display material. In a second embodiment of the present invention, the plurality of terminals is the VDD connection for a transistor backplane having two transistors per pixel, the two-transistor per pixel backplane being further intended for driving organic light emitting diode (OLED) display material. Skilled artisans will recognize that the plurality of terminals providing the ground or VDD connections may be routed out of array 2701 as column lines or as row lines, according to the array design. The remaining outputs of decoder 2702 are each connected to a single row of array 2701 through one of the plurality of three-terminal fuses 2704. Column connection terminals 2703 (analogous to row connection terminals 2702 supra) are electrically connected to array 2701 through three-terminal fuses 2706 such that each column connection terminal 2703 is connected to a single column connection through one of the fuses in the plurality of three-terminal fuses 2706. The row connection terminals 2702 are also connected to the shorting bar 2708 through a plurality of three-terminal fuses 2705, and the column connection terminals 2703 are connected to the shorting bar 2708 though a plurality of three-terminal fuses 2707.

During fabrication and at other times during the manufacturing of a display, shorting bar 2708 acts to tie all of the input connections on row connection terminals 2702 and column connection terminals 2703 together, placing them all at the same electrical potential and preventing inadvertent electrical discharges from damaging the array 2701. As shown in FIG. 27 by line 2709, the shorting bar 2708 may also be electrically connected to one or more ground connections, such as the ground connections associated with array 2701 and decoder 2702. However, in order to drive individual row, column, and pixel elements of array 2701 as described supra by applying signals through row terminal connections 2702 and column terminal connections 2703, the shorting bar 2708 must be removed. Prior to removing shorting bar 2708, each of the plurality of three terminal fuses 2705 and 2707 are singulated, severing the electrical connection between the shorting bar and the decoders 2702 and 2703. As described above, the order in which the severable connections in the three terminal fuses 2705 and 2707 can be controlled to ensure that potentially damaging currents do not flow into any of the row terminal connections 2702 and column terminal connections 2703. After the fuses 2705 and 2707 have been singulated, the shorting bar 2708 can be cut away or otherwise physically removed, as shown in FIG. 28. Alternately, since the shorting bar 2708 has been electrically de-coupled from the all of the row terminal connections 2702 and column terminal connections 2703, except for the row common terminal, the shorting bar could be optionally left in place while testing proceeds. Skilled artisans will further appreciate that an additional fuses could be incorporated into the common terminal connections to electrically sever the common terminal from the shorting bar, or to electrically sever the common terminal serving a single row.

In FIG. 28, shorting bar 2708 has been removed, while fuses 2704 and 2706 continue to prevent excessive currents from passing from the outputs of the row terminal connections 2702 and column terminal connections 2703 into the array 2701. During a test, fuses 2704 and 2706 may remain in place, and provide protection to array 2701. Upon completion of the test, selected fuses 2704 and 2706 may be singulated, severing the electrical connections between array 2701 and specific row terminal connections 2702 and column terminal connections 2703. The fuses selected to be severed are chosen so as to electrically isolate any of rows and columns in array 2701 which draw unacceptably high currents as established by the test conditions. The isolation of the selected rows and columns allows the remainder of the array to be operated without anomalous interactions and protects the drive circuits powering array 2701 from damage.

Figure 29:
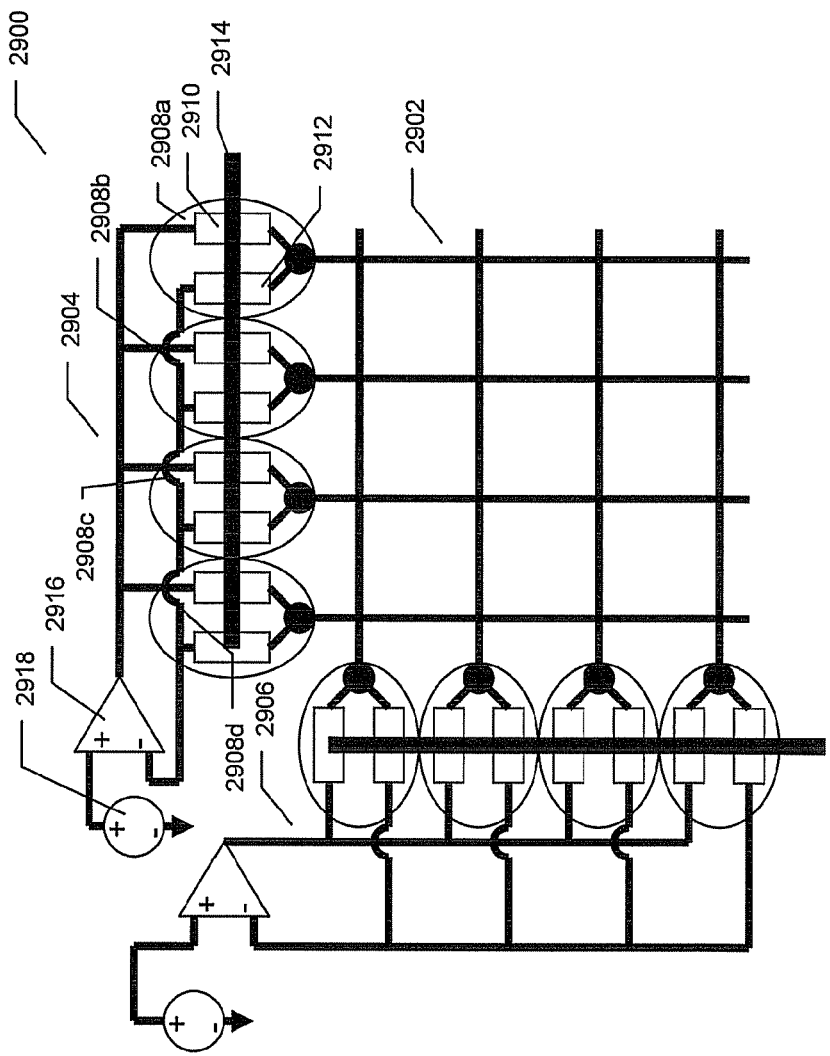
FIG. 29 depicts a block diagram of a device for testing a thin-film transistor backplane array in accordance with an aspect of the invention.

FIG. 29 depicts a simplified diagram of a device 2900 for testing a thin-film transistor backplane array 2902. Device 2900 comprises two decoders, 2904 and 2906. For the purposes of clarity, the only component pieces of decoder 2904 are specifically identified. However, in this example, decoder 2906 is identical to decoder 2904, with the exception that decoder 2904 is electrically coupled to the columns of thin-film transistor backplane array 2902 and decoder 2906 is electrically coupled to the rows of thin-film transistor backplane array 2902.

Decoder 2904 includes outputs 2908a-2908d, which are each electrically connected to one of the columns of thin-film transistor backplane array 2902. Each of outputs 2908a-2908d are identical, with the exception that they are each coupled to a different column in thin-film transistor backplane array 2902. Each output 2908a-2908d includes a force switch, such as force switch 2910 shown in output 2908a and a sense switch 2912. Select buss 2914 is electrically coupled to each of the outputs 2908a-2908d, and can selectively activate one or more of the outputs 2908a-2908d in response to receipt of a select code signal. As depicted in FIG. 29, force switch 2910 is electrically coupled to the output of force amplifier 2916, and sense switch 2912 is electrically coupled to a reference terminal on force amplifier 2916.

When an output, such as output 2908a is activated, a voltage from force voltage supply 2918 is amplified by force amplifier 2916 and passed through the selected output, such as output 2908a, to the transistors in a column in thin-film transistor backplane array 2902. When output 2908a is selected by select buss 2914, sense switch 2912 allows an electrical response from the column in thin-film transistor backplane array 2902 to pass to the reference terminal on force amplifier 2916, and the electrical response can be observed and measured in accordance with the methods described herein. In an exemplary embodiment of the present invention, the electrical response passed by sense switch 2912 to the reference terminal on force amplifier 2916 is used by the force amplifier 2916 to adjust the output 2908a so as to maintain a desired test potential on the input to the selected column. This provides a method for ensuring that a set of test conditions applied to the array 2902 remain constant even if the transistors comprising the decoder are varying due to aging effects or other factors.

Figure 30:
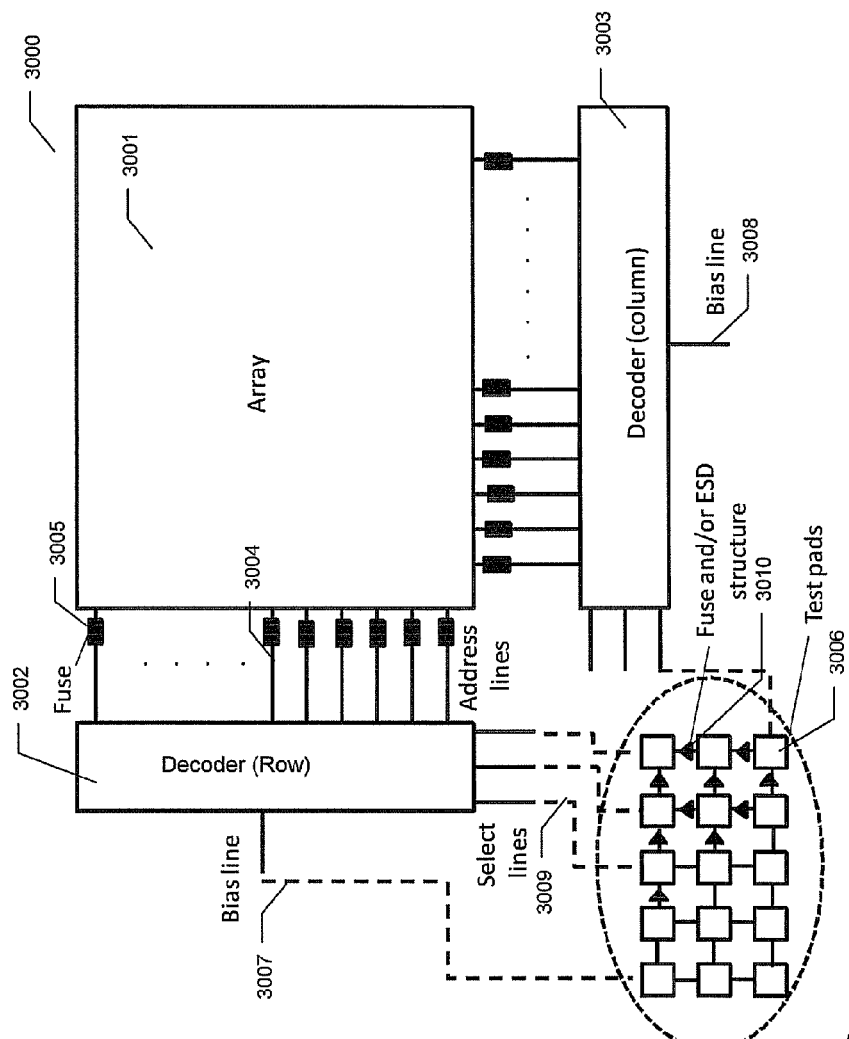
FIG. 30 depicts a configuration for testing an array structure in accordance with an aspect of the invention.

FIG. 30 depicts a schematic diagram of an example test configuration 3000 that includes array 3001. In configuration 3000, row decoder 3002 and column decoder 3003 are electrically coupled to array 3000 through a plurality of address lines 3004. For the purposes of clarity, several address lines are depicted in FIG. 30. However, those skilled in the art will appreciate that a greater or lesser number of address lines may be used. Each address line within the plurality of address lines 3004 includes a fuse, such as fuse 3005, wherein fuse 3005 is electrically connected in series between the address line and the array 3001. Row decoder 3002 is electrically coupled to an array of test pads 3006 via bias line 3007. Column decoder 3003 is electrically coupled to the array of test pads 3006 via bias line 3008. Those skilled in the art will appreciate that the electrical connections between bias line 3008 and the test pads 3006 have been omitted for clarity.

Select lines 3009 establish electrical connections between one or more of the test pads 3006 and the row decoder 3002. For clarity, the select lines between test pads 3006 and the column decoder 3003 have been omitted from FIG. 30. Also, for the purposes of clarity, several select lines are depicted in FIG. 30. However, those skilled in the art will appreciate that a greater or lesser number of select lines may be used. Select lines 3009 are used to control row decoder 3002 and select one or more addresses among address lines 3004 for activation during a test. Test pads 3006 may be electrically coupled together with the plurality of electrical connections depicted as elements 3010. Elements 3010 may be either fuses, or ESD protection devices, or a combination of both, including the fuses and ESD protection devices described herein. Elements 3010 may be used to protect the array from potentially damaging currents or voltages that may be applied during handling of the array 3001, or during testing.

When a test is performed, one or more probes may be electrically connected to test pads within the array of test pads 3006, and any of the testing methods or configurations described herein may be applied.

As used in FIG. 30, the term "address line" applies to the output connections of the appropriate decoder and the term "bias line" applies to an input connection of the appropriate decoder. However, those skilled in the art will appreciate the operational relationship of decoders and multiplexer circuits, and will also appreciate that a decoder may be configured to be a reversible device. As such, in various alternate configurations, the address lines may act as input connections, and/or the bias line may act as an output connection.

In configuration 3000, the row decoder 3002 and the column decoder 3003 may be fabricated at the same time as array 3001. Other structures, such as fuses 3005, or elements 3010 may also be fabricated at the same time as array 3001. Further, some or all of the components in configuration 3000 may be constructed on the same substrate as array 3001.

Prior to a test using configuration 3000, the test pads 3006 are electrically disconnected from each other. If elements 3010 are fuses, these fuses are singulated before a test. If elements 3010 are electrostatic discharge protection devices that normally function as an open circuit, such electrostatic discharge protection devices may be reused if necessary during a test.

While many of the examples and embodiments described herein have indicated the use of amorphous silicon thin-film transistors, those skilled in the art will appreciate that the arrangements, devices, and methods described herein may be used with thin-film transistors built with other compositions, such as polysilicon, microcrystalline silicon, other semiconductors and/or metal oxides, and/or organic materials.

Various arrangements and embodiments in accordance with the present invention have been described herein. All embodiments of each aspect of the invention can be used with embodiments of other aspects of the invention. It will be appreciated, however, that those skilled in the art will understand that changes and modifications may be made to these arrangements and embodiments, as well as combinations of the various embodiments without departing from the true scope and spirit of the present invention, which is defined by the following claims.

The invention claimed is:

1. A device for testing a thin-film transistor backplane array comprising:
a first decoder electrically coupled to each of a plurality of row connections on a thin-film transistor backplane array;
a second decoder electrically coupled to each of a plurality of column connections on the thin-film transistor backplane array, wherein the first decoder and the second decoder reside on the same substrate as the thin-film transistor backplane array; and
an electrical component capable of providing a severable electrical connection between a first portion of the device and a second portion of the device, wherein the electrical component comprises a three-terminal fuse that is capable of being activated to sever the electrical connection.

2. The device of claim 1 wherein the first portion of the device is a decoder address line.

3. The device of claim 1 wherein the first portion of the device is a decoder bias line.

4. The device of claim 1 wherein the first portion of the device is a decoder address line and the second portion of the device is a decoder bias line.

5. The device of claim 4 wherein the first decoder is a 1×N decoder.

6. The device of claim 4 wherein the second decoder is a 1×M decoder.

7. The device of claim 6 wherein the second decoder is a 2×N decoder.

8. The device of claim 1 wherein at least a portion of the first decoder and at least a portion of the second decoder comprises amorphous silicon.

9. The device of claim 1 wherein the electrical component providing a severable connection between a first portion of the device and a second portion of the device comprises an electrostatic discharge protection component.

10. The device of claim 9 wherein the electrostatic discharge protection component establishes an electrical connection between at least two portions of the device in response to the presence of an electrical current with a magnitude greater than a predetermined level.

11. The device of claim 9 wherein the electrostatic discharge protection component establishes an electrical connection between at least two portions of the device in response to the presence of a voltage with a magnitude greater than a predetermined level.

12. The device of claim 8 wherein:
the first decoder is a 1×N decoder;
the second decoder is a 1×M decoder; and the electrical component capable of providing a severable connection between the first portion of the device and the second portion of the device comprises an electrostatic discharge protection component.

13. The device of claim 8 wherein:
the first decoder is a 1×N decoder; and
the second decoder is a 1×M decoder.

\* \* \* \* \*